US008052791B2

(12) United States Patent
Matsumura et al.

(10) Patent No.: US 8,052,791 B2
(45) Date of Patent: Nov. 8, 2011

(54) CRYSTALLIZATION APPARATUS, CRYSTALLIZATION METHOD, PHASE MODULATION ELEMENT, DEVICE AND DISPLAY APPARATUS

(75) Inventors: Masakiyo Matsumura, Yokohama (JP); Yukio Taniguchi, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 219 days.

(21) Appl. No.: 12/425,212

(22) Filed: Apr. 16, 2009

(65) Prior Publication Data

US 2009/0203231 A1    Aug. 13, 2009

Related U.S. Application Data

(62) Division of application No. 10/790,828, filed on Mar. 3, 2004, now Pat. No. 7,540,921.

(30) Foreign Application Priority Data

Apr. 22, 2003  (JP) ................................. 2003-117486

(51) Int. Cl.
    *C30B 1/00* (2006.01)
(52) U.S. Cl. .......................... 117/9; 117/4; 117/5; 117/8
(58) Field of Classification Search .................. 117/4, 5, 117/8, 9
    See application file for complete search history.

(56) References Cited

U.S. PATENT DOCUMENTS

| | | |
|---|---|---|
| 5,539,568 A | 7/1996 | Lin et al. |
| 5,710,620 A | 1/1998 | Taniguchi |
| 5,715,089 A | 2/1998 | Shiraishi |
| 5,846,678 A | 12/1998 | Nishigori et al. |
| 6,388,386 B1 * | 5/2002 | Kunii et al. ................. 315/169.3 |
| 7,537,660 B2 | 5/2009 | Taniguchi et al. |
| 2007/0151507 A1 | 7/2007 | Taniguchi et al. |
| 2008/0032244 A1 | 2/2008 | Taniguchi et al. |
| 2009/0061603 A1 | 3/2009 | Shimoto et al. |

FOREIGN PATENT DOCUMENTS

| | | |
|---|---|---|
| EP | 1 047 119 | 10/2000 |
| JP | 2000-306859 | 11/2000 |
| JP | 2002-151407 | 5/2002 |
| TW | 436665 | 5/2001 |
| TW | 461113 | 10/2001 |

OTHER PUBLICATIONS

C-H Oh, et al., "A Novel Phase-Modulated Excimer-Laser Crystallization Method of Silicon Films," Japanese Journal of Applied Physics, vol. 37, Part 2, No. 5A, pp. L492-L495, May 1, 1998.

M. Nakata, et al., "A New Nucleation-Site-Control Excimer-Laser-Crystallization Method," Japanese Journal of Applied Physics, vol. 40, Part 1, No. 5A, pp. 3049-3054, May 2001.

M. Matsumura, et al., "Advanced Laser-Crystallization Technologies of Si for High-Performance TFTs," IDW '02 AMD5-1, pp. 263-266, 2001.

(Continued)

Primary Examiner — Matthew Song

(57) ABSTRACT

A phase modulation element according to the present invention has a first area having a first phase value based on a phase modulation unit having a predetermined size and a second area having a second phase value based on the phase modulation unit having the predetermined size, and each phase distribution is defined by a change in area shares of the first area and the second area depending on each position.

2 Claims, 25 Drawing Sheets

OTHER PUBLICATIONS

"Advanced Laser-Crystallization Technologies of Si for High-Performance TFTS," International Display Workshops, pp. 1-6, 2002.

M. Matsumura, "Preparation of Ultra-Large Grain Silicon Thin Films by Excimer-Laser," Journal of the Surface Science Society of Japan, vol. 21, No. 5, pp. 278-287.

K. Inoue, et al., "Amplitude and Phase Modulated Excimer-Laser Melt-Regrowth Method of Silicon Thin-Film—A New Growth of 2-D Position Controlled Large—Grains," The Institute of Electronics, Information and Communication Engineers Transations, vol. J85-C, No. 8, pp. 624-629, Aug. 2002.

U.S. Appl. No. 12/403,776, filed Mar. 13, 2009, Taniguchi, et al.

Office Action issued on Jan. 28, 2011 in the corresponding Taiwanese Patent Application No. 093105225 (with English Translation).

* cited by examiner

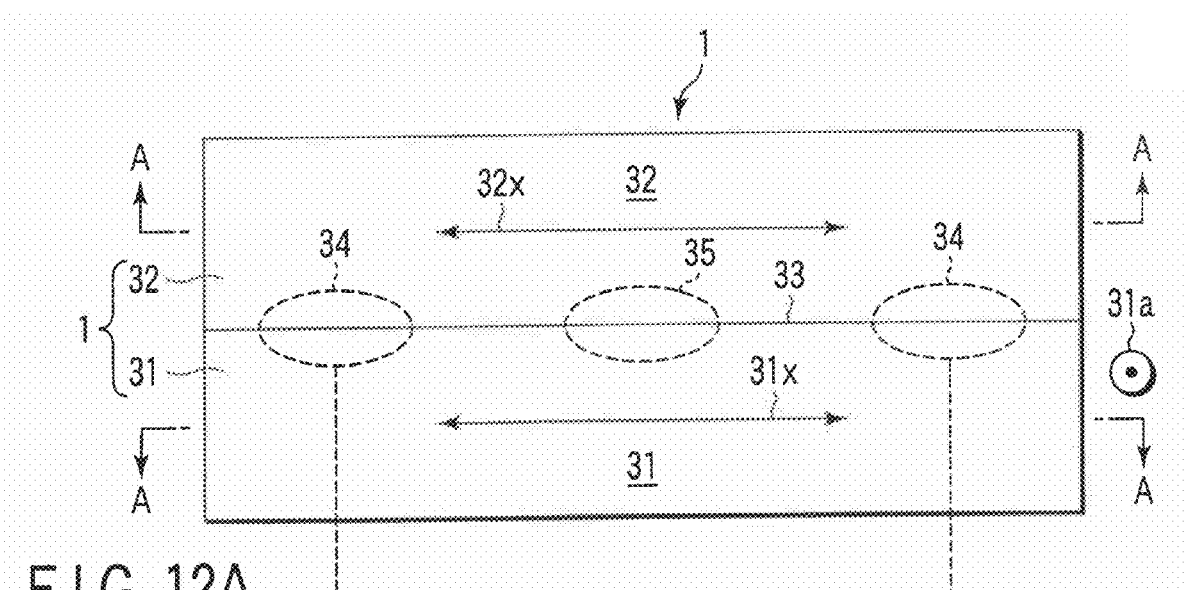
F I G. 12A
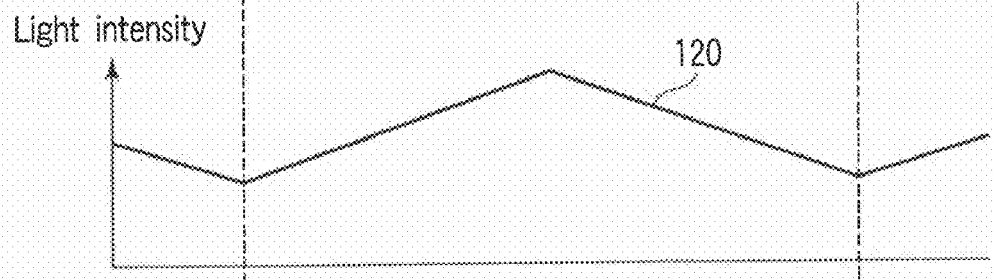
F I G. 12B
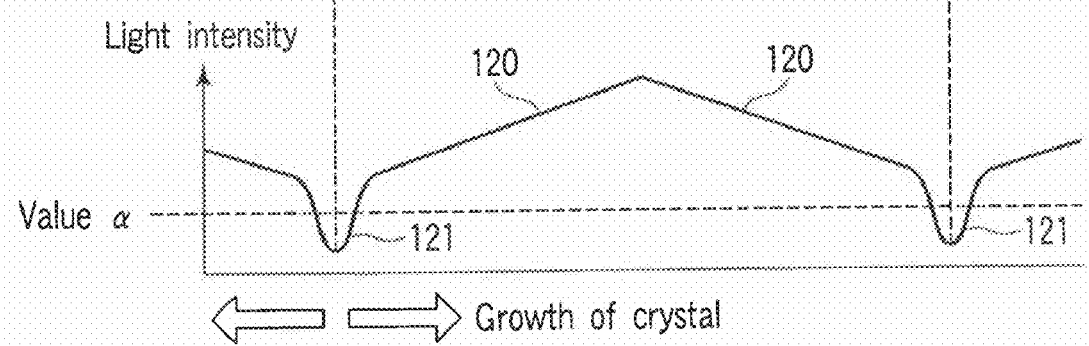
F I G. 12C

Light intensity

Light intensity

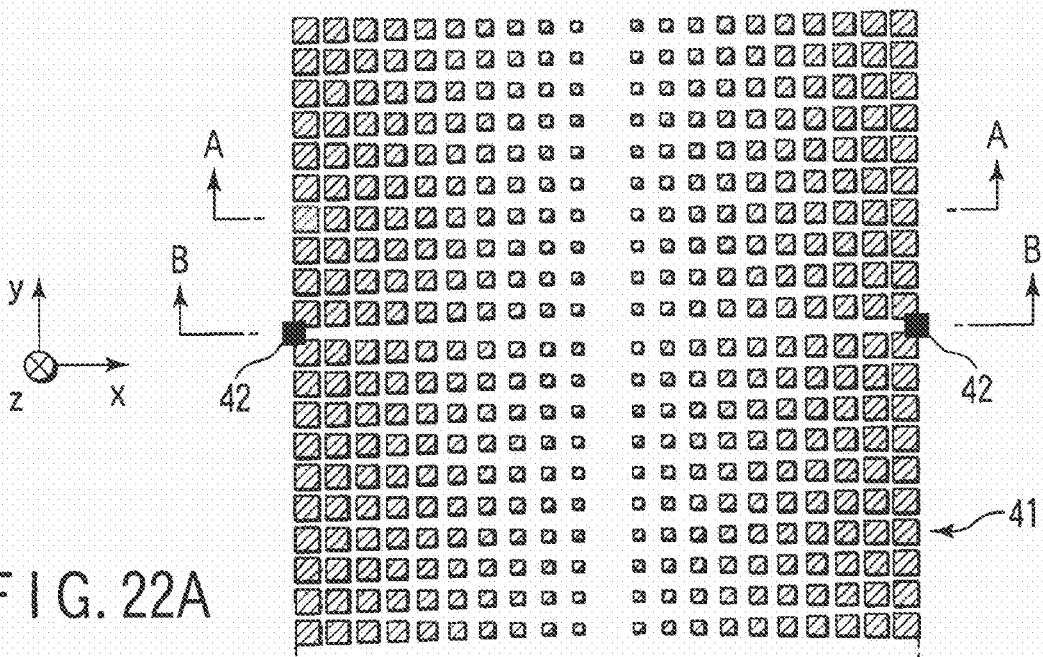
F I G. 22A
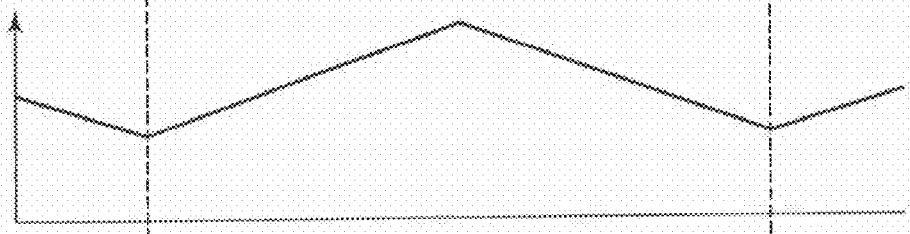
F I G. 22B
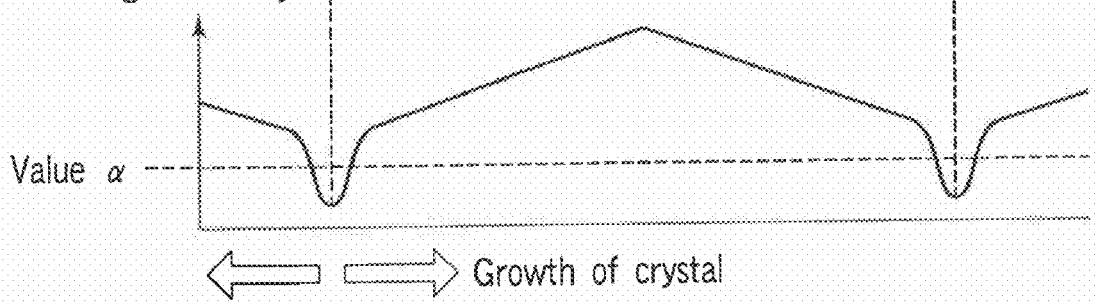
F I G. 22C

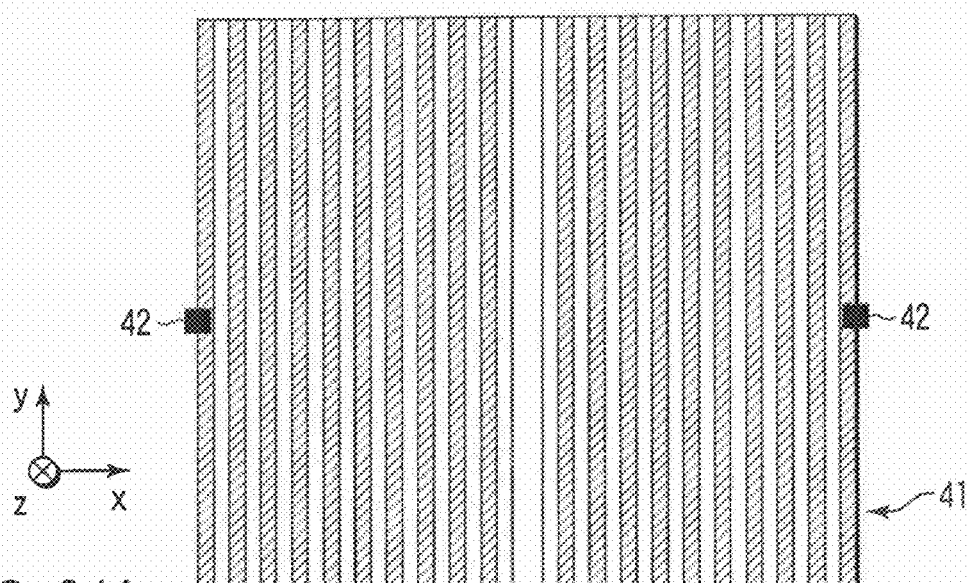
F I G. 24A
F I G. 24B
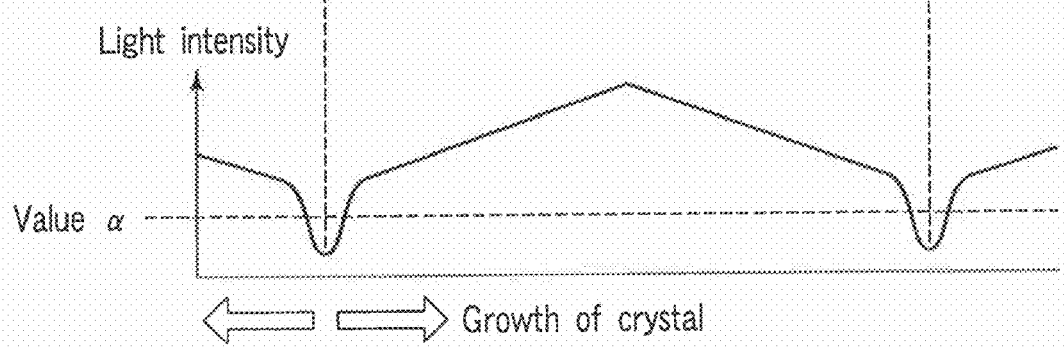
F I G. 24C

CRYSTALLIZATION APPARATUS, CRYSTALLIZATION METHOD, PHASE MODULATION ELEMENT, DEVICE AND DISPLAY APPARATUS

CROSS-REFERENCE TO RELATED APPLICATIONS

This application is a division of U.S. application Ser. No. 10/790,828, filed Mar. 3, 2004, now U.S. Pat. No. 7,540,921, and is based upon and claims the benefit of priority from prior Japanese Patent Application No. 2003-117486, filed Apr. 22, 2003, the entire content of which are incorporated herein by reference.

BACKGROUND OF THE INVENTION

1. Field of the Invention

The present invention relates to a crystallization apparatus, a crystallization method, a phase modulation element, a device and a display apparatus used to generate a crystallized semiconductor film by irradiating a polycrystal semiconductor film or an amorphous semiconductor film with laser beams having a predetermined light intensity.

2. Description of the Related Art

For example, a thin film transistor (TFT) used for, e.g., a switching element which controls a voltage applied to pixels in a liquid crystal display (LCD) is formed on an amorphous silicon layer or a polysilicon layer.

The polysilicon layer has a higher mobility of electrons or electron holes than that of the amorphous silicon layer. Therefore, when a transistor is formed on the polysilicon layer, a switching speed is increased and a response speed of a display is improved as compared with a case that a transistor is formed on the amorphous silicon layer.

Further, a peripheral LSI can be constituted of a thin film transistor. Furthermore, there is an advantage that a design margin of any other component can be reduced. Moreover, when peripheral circuits such as a driver circuit or a DAC are incorporated in a display, these peripheral circuits can be operated at a higher speed.

Although the polycrystal silicon is formed of an aggregation of crystal grains, it has a lower mobility of electrons or electron holes than that of single crystal silicon. Additionally, many thin film transistors formed on the polycrystal silicon have a problem of irregularities in crystal grain boundary number in a channel portion. Thus, in order to improve the mobility of electrons or electron holes and reduce irregularities in crystal grain boundary number in the channel portion, there has been proposed a crystallization method which generates crystallized silicon with a large grain size.

As this type of crystallization method, there is known a "phase control ELA (Excimer Laser Annealing) method)" which generates a crystallized semiconductor film by irradiating a phase shifter approximated to a polycrystal semiconductor film or an amorphous semiconductor film in parallel with excimer laser beams. The detail of the phase control ELA method is disclosed in, e.g., "Surface Science Vol. 21, No. 5, pp. 278-287, 2000".

In the phase control ELA method, a light intensity distribution with an inverse peak pattern (pattern that a light intensity is substantially zero at the center and the light intensity is suddenly increased toward the periphery) that a light intensity is substantially zero at a point corresponding to a phase shift portion of a phase shifter is generated, and a polycrystal semiconductor film or an amorphous semiconductor film is irradiated with light beams having this light intensity distribution with the inverse peak pattern. As a result, a temperature gradient is generated in a fusion area in accordance with the light intensity distribution, a crystal nucleus is formed at a part which is solidified first in accordance with a point where the light intensity is substantially zero, and a crystal grows in the lateral direction from the crystal nucleus toward the periphery (which will be referred to as a "lateral growth" or a "lateral-directional growth" hereinafter), thereby producing single crystal grains with a large particle size.

Additionally, Jpn. Pat. Appln. KOKAI Publication No. 2000-306859 discloses a technique to perform crystallization by irradiating a semiconductor film with light beams having a light intensity distribution with an inverse peak pattern generated through a phase shift mask (phase shifter).

Further, "Amplitude of Silicon Thin Film/Phase Control Excimer Laser Fusion Recrystallization Method—New 2-D Position-controlled Large Crystal Grain Forming Method—", Inoue, Nakata and Matsumura, The institute of Electronics, Information and Communication Engineers Transactions Vol. J85-C, No. 8, pp. 624-629, August 2002 discloses a technique to perform crystallization by irradiating a semiconductor film with light beams having a light intensity including a concave pattern and an inverse pattern generated by combining a phase shifter and a light absorption distribution (see FIG. 3 and a relevant description).

As disclosed in Jpn. Pat. Appln. KOKAI Publication No. 2000-306859, according to the technique to form a light intensity distribution with an inverse peak pattern by using a phase shifter, the light intensity distribution with the inverse peak pattern is formed at a part corresponding to a phase shift portion. However, since the light intensity is not linearly increased and an additional irregular distribution is generated around the light intensity distribution with the inverse peak pattern, the growth of the crystal is apt to be finished halfway.

It is to be noted that the obtained light intensity distribution may be possibly caused to approximate an ideal distribution by adjusting an angle distribution of illumination light beams relative to the phase shifter or designing an arrangement position of the phase shifter. However, that design cannot be analytically performed with a perspective, and it can be expected that very complicated design conditions are given even if the analytic design can be realized.

On the other hand, as disclosed in The institute of Electronics, Information and Communication Engineers Transactions, according to the technique in which the phase shifter is combined with the light absorption distribution, a light intensity distribution with the concave pattern and the inverse peak pattern for crystallization can be obtained. However, it is difficult to realize this distribution. That is, forming a film having a light absorption distribution which continuously varies is generally difficult. Further, light beams having a very strong intensity for crystallization is undesirable since it tends to generate a deterioration in a film material of a film having a light absorption distribution due to heat from light absorption or a chemical change when a film to be crystallized is irradiated.

BRIEF SUMMARY OF THE INVENTION

It is an object of the present invention to provide a crystallization apparatus which can generate a crystallized semiconductor film with a large grain size by causing a crystal to grow in the lateral direction from a crystal nucleus, a crystallization method, a thin film transistor using a crystallized semiconductor film and a display apparatus.

According to an aspect of the present invention, there is provided a crystallization apparatus comprising: a phase modulation element in which a phase of outgoing light beams relative to incident light beams differs depending on each position; an illumination system used to generate the incident light beams which enter the phase modulation element; an image formation optical system provided on an outgoing radiation side of the phase modulation element; and a stage used to support a substrate having a non-single crystal semiconductor film provided on an outgoing radiation side of the image formation optical system, wherein the phase modulation element has a phase distribution based on a phase modulation unit which is optically smaller than a radius of a point spread distribution range of the image formation optical system when converted to an image formation surface of the image formation optical system.

According to another aspect of the present invention, there is provided an exposure apparatus comprising: a phase modulation element in which a phase of outgoing light beams relative to incident light beams differs depending on each position; an illumination system used to generate the incident light beams which enter the phase modulation element; an image formation optical system provided on an outgoing radiation side of the phase modulation element; and an image formation optical system arranged in a light path between the phase modulation element and a predetermined surface, wherein the phase modulation element has a phase distribution based on a phase modulation unit which is optically smaller than a radius of a point spread distribution range of the image formation optical system when converted to an image formation surface of the image formation optical system.

According to still another aspect of the present invention, there is provided a crystallization method comprising: illuminating a phase modulation element having a phase distribution based on a phase modulation unit which is optically smaller than a radius of a point spread distribution range of an image formation optical system when converted to an image formation surface; and irradiating a polycrystal semiconductor film or an amorphous semiconductor film with light beams having a predetermined light intensity distribution through the image formation optical system arranged in a light path between the phase modulation element and the polycrystal semiconductor film or the amorphous semiconductor film, thereby generating a crystallized semiconductor film.

According to a further aspect of the present invention, there is provided a crystallization method comprising: illuminating a phase modulation element having a phase distribution based on a phase modulation unit which is optically smaller than a radius of a point spread distribution range of an image formation optical system when converted to an image formation surface; and forming a predetermined light intensity distribution on a predetermined surface through the image formation optical system arranged in a light path between the phase modulation element and the predetermined surface.

According to a still further aspect of the present invention, there is provided a phase modulation element having a phase distribution based on a phase modulation unit having a predetermined size, comprising: a first area having a first phase value; and a second area having a second phase value, wherein the phase distribution is defined by a change in area shares of the first area and the second area depending on each position.

According to a still further aspect of the present invention, there is provided a phase modulation element having a phase distribution based on a phase modulation unit having a predetermined size, comprising: a plurality of divided areas each having a fixed phase value, wherein each of the divided areas has a phase distribution that the phase value cyclically varies in accordance with each divided area.

According to a still further aspect of the present invention, there is provided a phase modulation element having a phase distribution based on a phase modulation unit having a predetermined size, comprising: a first stripe-like area which has a first phase distribution and extends in a direction along which a phase varies; and a second stripe-like area which has a second phase distribution and extends in the direction along which the phase varies, wherein the first stripe-like area and the second stripe-like area are adjacent to each other with a border line parallel with the direction along which the phase varies therebetween, and an average phase value on the first stripe-like area side is substantially different from an average phase value on the second stripe-like area side in a local area on the border line.

According to a still further aspect of the present invention, there is provided a device comprising: a semiconductor film manufactured by a crystallization method, the crystallization method comprising: illuminating a phase modulation element having a phase distribution based on a phase modulation unit which is optically smaller than a radius of a point spread distribution range of an image formation optical system when converted to an image formation surface; and forming a predetermined light intensity distribution on a predetermined surface through the image formation optical system arranged in a light path between the phase modulation element and the predetermined surface.

According to a still further aspect of the present invention, there is provided a display apparatus comprising: a pair of substrates joined to each other with a predetermined gap therebetween; an electro-optic material held in the gap; an opposed electrode formed on one of the substrates; and a semiconductor thin film which can provide pixel electrodes formed on the other substrate and thin film transistors which drive the pixel electrodes, wherein the semiconductor thin film is a semiconductor film crystallized by irradiating the polycrystal semiconductor film or the amorphous semiconductor film with light beams having a predetermined light intensity distribution through a phase modulation element in which a phase of outgoing light beams relative to incident light beams varies depending on each position and an image formation optical system.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12A is a schematic view illustrating a yet further embodiment of the phase modulation element according to the present invention;

FIG. 12B is a schematic view showing a light intensity distribution along a line A-A in FIG. 12A;

FIG. 12C is a schematic view showing a light intensity distribution along a border line B-B in FIG. 12A;

FIG. 22A is a schematic view illustrating a yet further embodiment of the phase modulation element according to the present invention;

FIG. 22B is a schematic view showing a light intensity distribution along the line A-A in FIG. 22A;

FIG. 22C is a schematic view showing a light intensity distribution along the border line B-B in FIG. 22A;

FIG. 24A is a schematic view illustrating still another embodiment of the phase modulation element according to the present invention;

FIG. 24B is a schematic view showing a light intensity distribution along the line A-A in FIG. 24A;

FIG. 24C is a schematic view showing a light intensity distribution along the border line B-B in FIG. 24A;

DETAILED DESCRIPTION OF THE INVENTION

Embodiments according to the present invention will now be described hereinafter with reference to the accompanying drawings.

Figure 1:
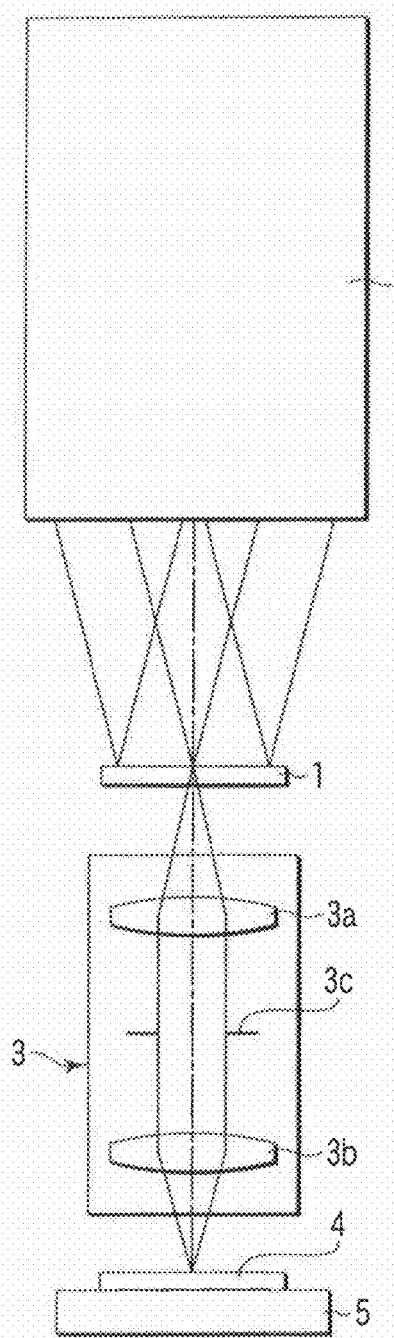
FIG. 1 is a schematic view illustrating an example of a structure of a crystallization apparatus according to an embodiment of the present invention.
Figure 2:
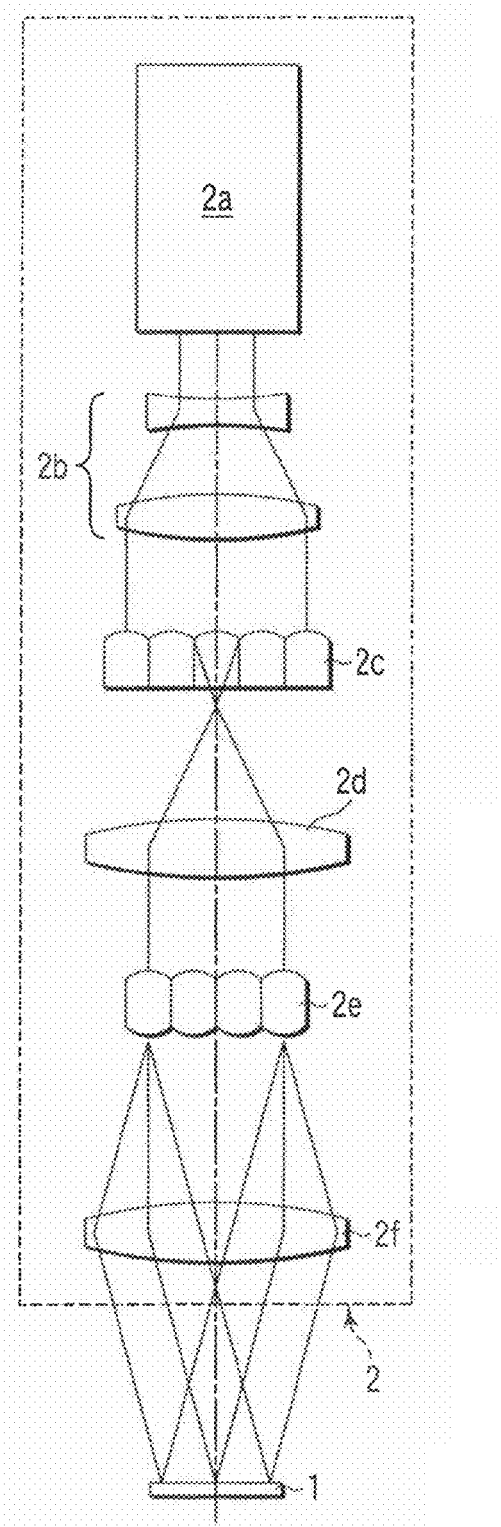
FIG. 2 is a schematic view illustrating an example of an internal structure of an illumination system depicted in FIG. 1.

FIG. 1 is a view schematically showing a structure of a crystallization apparatus according to an embodiment of the present invention. Further, FIG. 2 is a view schematically showing an internal structure of an illumination system of FIG. 1. Referring to FIGS. 1 and 2, a crystallization apparatus according to this embodiment comprises an illumination system 2 used to illuminate a phase modulation element 1. A structure and an effect of the phase modulation element 1 will be described later.

The illumination system 2 comprises a laser beam source which generates incident light beams which enter the phase modulation element 1, e.g., a KrF excimer laser beam source 2a which supplies light beams having a wavelength of 248 nm used to crystallize a non-single crystal semiconductor film such as an amorphous silicon film or a polycrystal silicon film. It is to be noted that any other appropriate beam source such as an XeCl excimer laser beam source or a YAG laser beam source can be also used as the beam source 2a.

Laser beams supplied from the beam source 2a are expanded through a beam expander 2b and then enter a first fly-eye lens 2c.

A plurality of pseudo-beam sources are formed on a rear focal plane of the first fly-eye lens 2c (an image of the beam source 2a is transferred to the rear focal plane of the first fly-eye lens 2c and pseudo-beam sources are defined). Light fluxes from the rear focal plane of the first fly-eye lens 2c, i.e., the plurality of (pseudo-) beam sources are led to an incident plane of a second fly-eye lens 2e through a first condenser optical system 2d. As a result, more pseudo-beam sources than those on the rear focal plane of the first fly-eye lens 2c are formed on a rear focal plane of the second fly-eye lens 2e (an image of the first fly-eye lens 2c is transferred on the rear focal plane of the second fly-eye lens 2e and pseudo-beam sources are defined). Light fluxes from the plurality of beam sources formed on the rear focal plane of second fly eye lens 2e are caused to enter the phase modulation element 1 through a second condenser optical system 2f.

The first fly-eye lens 2c and the first condenser optical system 2d constitute a first homogenizer (i.e., a homogenization mechanism) which gives homogenization (effect) to illumination beams from the beam source 2a. Therefore, the laser beams supplied from the beam source 2a are caused to enter the second fly-eye lens 2e in a state that an in-plane intensity distribution is homogenized by this first homogenizer.

Furthermore, the second fly-eye lens 2e and the second condenser optical system 2f constitute a second homogenizer, and the phase modulation element 1 is irradiated with laser beams whose incident angle is homogenized by the first homogenizer in a state that the in-plane intensity distribution is substantially homogeneous. In this manner, an entire area of the phase modulation element 1 is irradiated with the laser beams having the homogenous incident angle distribution and the homogenous in-plane intensity distribution by the first fly-eye lens 2c, the first condenser optical system 2d, the second fly-eye lens 2e and the second condenser optical system 2f.

The laser beams phase-modulated by the phase modulation element 1 are caused to enter a processed substrate 4 provided on an outgoing radiation side of an image formation optical system 3.

The image formation optical system 3 comprises a convex lens 3a, a convex lens 3b and an aperture diaphragm 3c provided between the both lenses, and can position the phase modulation element 1 and the processed substrate 4 in an optically conjugate positional relationship.

In other words, the processed substrate 4 has a film which is subjected to crystallization processing, and is set on a surface optically conjugate with the phase modulation element 1 (image surface of the image formation optical system 3). It is to be noted that the processed substrate 4 is positioned and held at a predetermined position on a substrate stage 5 by using a vacuum chuck, an electrostatic chuck or the like.

The aperture diaphragm 3c can arbitrary set a size of an aperture (light transmission portion). It is to be noted that the aperture diaphragm 3c can be arbitrarily selected from, e.g., an iris diaphragm which can continuously change a size of the aperture. Moreover, a plurality of plate-like bodies each of which has an aperture with a predetermined size provided thereto may be prepared and arbitrarily set in a light path. In any case, the size of the aperture of the aperture diaphragm 3c (which is substantially an image side numerical aperture NA of the image formation optical system 3) is set so as to generate a necessary light intensity distribution on a semiconductor film of the processed substrate 4 as will be described later.

It is to be noted that the image formation optical system 3 may be a refraction type optical system, a reflection type optical system or a refraction/reflection type optical system. Additionally, the processed substrate 4 is obtained by sequentially forming an underlying film (lower layer protection film) and a non-single crystal semiconductor film such as an amorphous silicon film on, e.g., a liquid crystal display glass sheet by chemical vapor deposition (CVD).

FIGS. 3A to 3F are views illustrating a basic principle of the present invention. Like reference numerals denote parts equal to those in FIGS. 1 and 2, thereby eliminating their detailed explanation.

Generally, a light amplitude distribution U (x, y) of image formation by the phase modulation element 1 is represented by the following expression (1):

$$U(x,y)=T(x,y)*ASF(x,y) \quad (1)$$

It is to be noted that T (x, y) indicates a complex amplitude transmittance distribution of the phase modulation element 1; *, a convolution (convolution integral); an ASF (x, y), a point spread function of the image formation optical system 3. Furthermore, the point spread function is defined as an amplitude distribution of a point image obtained by the image formation optical system.

It is to be noted that the complex amplitude transmittance distribution T of the phase modulation element 1 is represented by the following expression (2) since it has a homogenous amplitude;

$$T=T_0 e^{i\phi(x,y)} \quad (2)$$

It is to be noted that $T_0$ is a fixed value and $\phi$ (x, y) indicates a phase distribution in the expression (2).

Moreover, when the image formation optical system 3 has a homogenous circular pupil and no aberration, a relationship represented by the following expression (3) is achieved in connection with the point spread function ASF (x, y):

$$ASF(x,y) \propto 2J_1(2\pi/\lambda \cdot NA \cdot r)/(2\pi/\lambda \cdot NA \cdot r) \quad (3)$$

where $r=(x^2+y^2)^{1/2}$

It is to be noted that $J_1$ indicates a Bessel function, $\lambda$ indicates a wavelength of light beams and NA indicates an image side numeral aperture of the image formation optical system 3 as describe above in the expression (3).

Figure 3A:
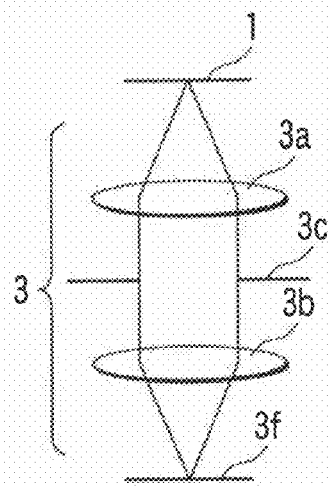
FIGS. 3A to 3F are schematic views illustrating a basic principle of the present invention.
Figure 3B:
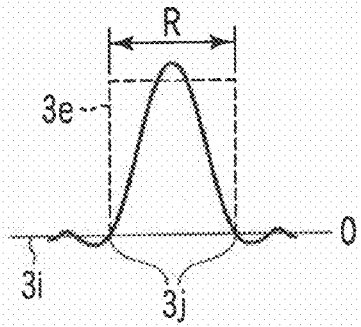

The point spread function of the image formation optical system 3 depicted in FIG. 3A is a light intensity distribution on an image surface 3f of the processed substrate 4 and shown in FIG. 3B. A horizontal axis shows an incident plane of the processed substrate 4, and a vertical axis shows an incident light intensity. The point spread function of the image formation optical system 3 depicted in FIG. 3A can be approximated by using a cylindrical shape 3e having a diameter R indicated by a broken line in FIG. 3B. That is, a result of integrating the complex amplitude distribution in a circle having a diameter R' (value optically corresponding to the diameter R in FIG. 3B) on the phase modulation element 1 depicted in FIG. 3C determines a complex amplitude on the image surface 3f shown in FIG. 3A.

As described above, the light amplitude of image formation image-formed on the image plane 3f, i.e., the light intensity is given by the convolution between the complex amplitude transmittance distribution of the phase modulation element 1 and the point spread function.

Figure 3C:
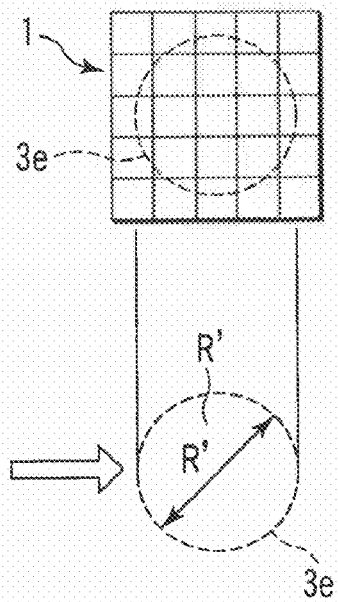

Giving a consideration by approximating the point spread function by using the cylindrical shape 3e, a result obtained by integrating the complex amplitude transmittance of the phase modulation element 1 with a homogenous weight in the circular point spread distribution range shown in FIG. 3C becomes the complex amplitude on the image surface 3f, and a square of its absolute value becomes the light intensity. It is to be noted that the point spread distribution range R in the image formation optical system 3 means a range in an intersection 3j of an amplitude curve and a horizontal axis 3i in FIG. 3B plotted by using the point spread function.

Figure 3D:
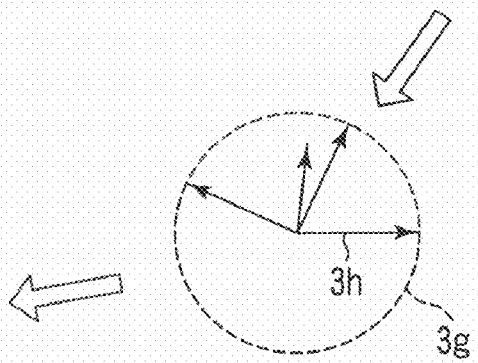
Figure 3E:
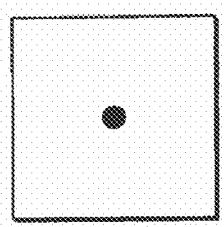
Figure 3F:
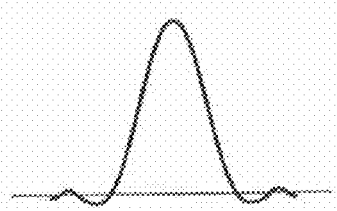

Therefore, the light intensity is increased as a change in phase in the point spread distribution range R is small. On the contrary, the light intensity is decreased as a change in phase is large. This point can be readily understood by considering a sum of phase vectors 3h in a unit circle 3g as shown in FIG. 3D. When the image surface 3f is an object, e.g., a semiconductor film, the point spread function of FIG. 3B is a point spread function such as shown in FIG. 3F. FIG. 3E is a view showing a point on the image surface 3f, and a light intensity at this point is determined by the above-described process.

Figures 4A, 4B, 4C:
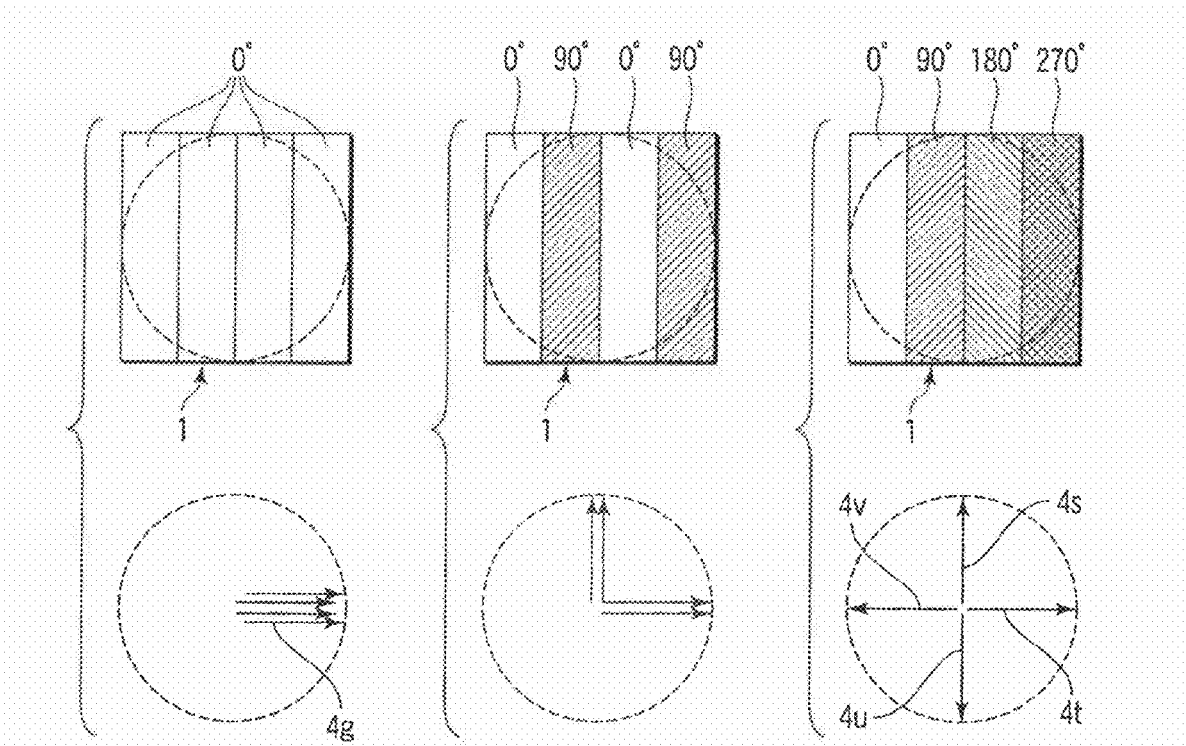
FIGS. 4A to 4C are schematic views illustrating a relationship between changes in phase and a light intensity in a point spread distribution range.

FIGS. 4A to 4C are views showing a typical relationship between changes in phase in the point spread distribution range R and the light intensity. FIG. 4A is a view showing a case that phase values in four areas are all zero degree, a sum of four phase vectors 4g each having an amplitude of E in a direction of zero degree is an amplitude 4 E, and its square corresponds to a light intensity 16I.

FIG. 4B is a view showing a case that phase values of two areas are zero degree and phase values of the other two areas are 90 degrees. In this case, a sum of the two phase vectors in the direction of zero degree and the two phase vectors in the direction of 90 degrees corresponds to an amplitude $2\sqrt{2}$ E, and its square corresponds to a light intensity 8I. FIG. 4C is a view showing a case of an area having a phase value of zero degree, an area having a phase value of 90 degrees, an area having a phase value of 180 degrees and an area having a phase value of 270 degrees.

In this case, an amplitude of a sum of a phase vector 4s in the direction of zero degree, a phase vector 4t in the direction of 90 degrees, a phase vector 4u in the direction of 180 degrees and a phase vector 4v in the direction of 270 degrees is 0E, and its square corresponds to a light intensity 0I.

Figures 5A, 5B:
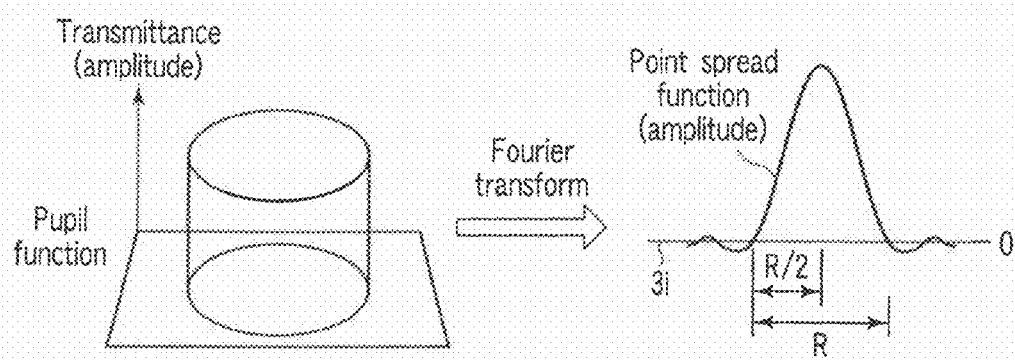
FIGS. 5A and 5B are schematic views illustrating a relationship between a pupil function and a point spread function in an image formation optical system.

FIGS. 5A and 5B are views showing a relationship between a pupil function and the point spread function in the image formation optical system 3.

Generally, a point spread function (FIG. 5B) is given by a Fourier transform of a pupil function (FIG. 5A). Specifically, when the image formation optical system 3 has a homogenous circular pupil and no aberration, the point spread function ASF (x, y) is presented by the above-described expression (3). However, it is not restricted to the above if there is an aberration in the image formation optical system 3 or the image formation optical system 3 has a pupil function other than the homogenous circular pupil.

When the image formation optical system 3 has the homogenous circular pupil and no aberration, it is known that the a radius R/2 of a central area (i.e., an airy disk) until the point spread function becomes 0 first is represented by the following expression (4):

$$R/2 = 0.61 \lambda/NA \quad (4)$$

In the present invention, the point spread distribution range R means a circular central area until the point spread function F(x) becomes zero first as shown in FIGS. 3B and 5B. As apparent from FIGS. 4A to 4C, when a circle optically corresponding to the point spread distribution range R of the image formation optical system includes a plurality of (four in FIGS. 4A to 4C) phase modulation units, an amplitude of the light beams, i.e., the light intensity can be analytically controlled in accordance with a simple calculation by using a sum of a plurality of phase vectors 4g. As a result, a relatively complex light intensity distribution can be comparatively readily obtained.

Therefore, in the present invention, in order to freely control the light intensity, the phase modulation unit of the phase modulation element 1 must be optically smaller than a radius of the point spread distribution range R (see FIG. 3B) of the image formation optical system 3, i.e., R/2. In other words, a size of a phase distribution based on the phase modulation unit of the phase modulation element 1 must be smaller than the radius R/2 of the point spread distribution range R of the image formation optical system 3 when converted to the image formation surface of the image formation optical system on the image side of the image formation optical system 3. Here, in case of a later-described cell type, the phase modulation unit means a size of a shortest side of the cell. In case of a pixel type, it means a length of one side.

A description will now be given as to an embodiment of the phase modulation element 1 which can be used in this embodiment.

Figure 6A:
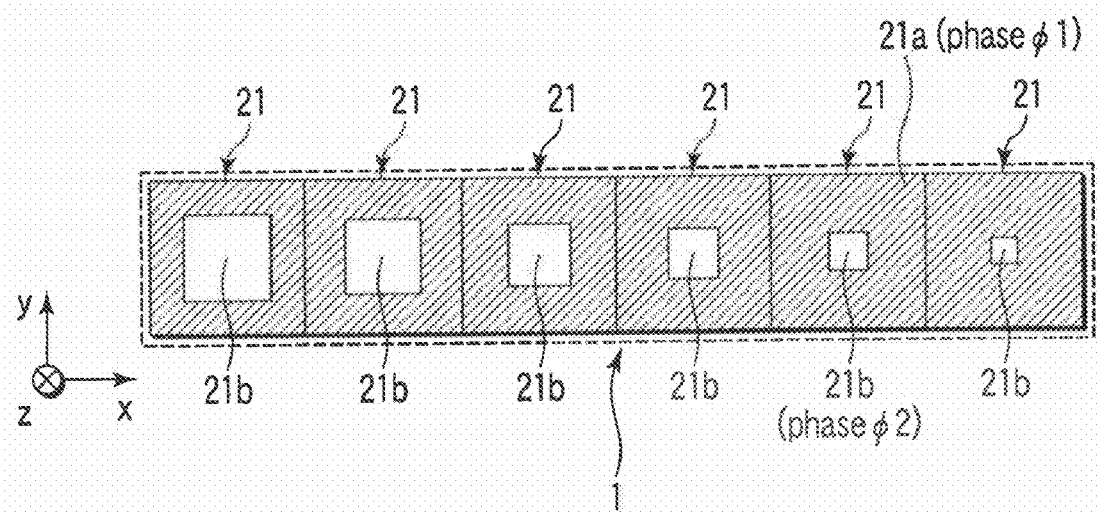
FIG. 6A is a schematic view illustrating an example of an embodiment of a phase modulation element.
Figure 6B:
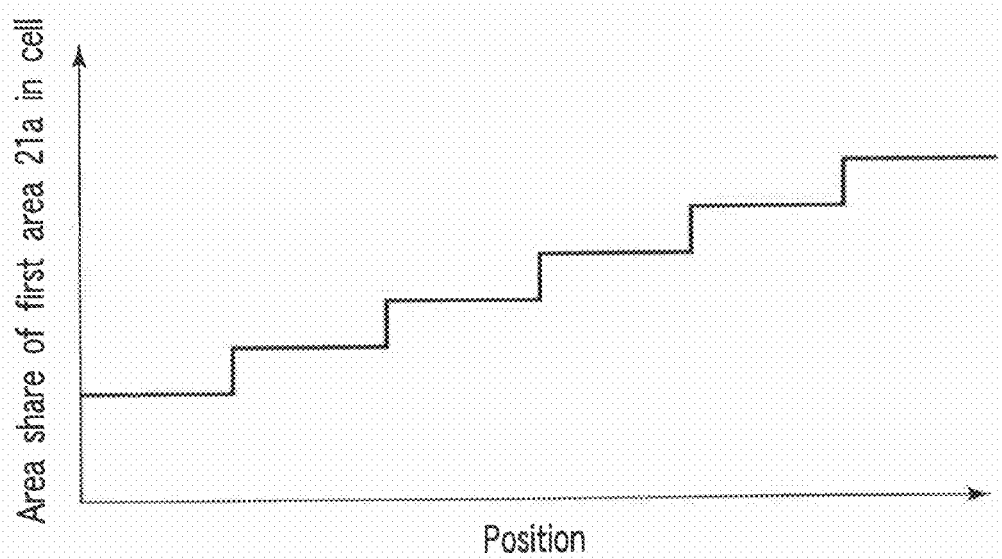
FIG. 6B is a schematic view illustrating an example of changes in area shares of each cell of the phase modulation element depicted in FIG. 6A.

FIG. 6A schematically shows a structure of the phase modulation element 1, and FIG. 6B shows changes in area shares of each cell of the phase modulation element depicted in FIG. 6A.

Referring to FIG. 6A, the phase modulation element 1 has a plurality of cells 21 which have sizes optically smaller than the radius R/2 of the point spread distribution range R of the image formation optical system 3 and are indicated by a rectangular wavy line. Further, each phase modulation element 1 has a first area 21a which is shaded and has a first phase value φ1 and a second area 21b which is shown as a non-shaded space and has a second phase value φ2.

As shown in FIG. 6A, area shares of the first area 21a having the phase value φ1 (e.g., 90 degrees) and the second area 21b having the phase value φ2 (e.g., zero degree) in each cell 21 vary in accordance with each cell. In other words, there is provided a phase distribution that the area shares of the first area 21a having the phase value φ1 and the second area 21b having the phase value φ2 vary depending on each position. More specifically, an occupied area of the second area 21b having the phase value φ2 in the cell is largest in the cell shown on the leftmost side, and it is smallest in the cell shown on the rightmost side. It monotonously varies between these cells. Therefore, in the phase modulation element 1 formed of six cells depicted in FIG. 6, sizes of the areas having the different phase values continuously vary in each cell as shown in FIG. 6B. The light beams to enter the phase modulation element 1 are transmitted from a front surface of a paper sheet (front side) in the direction of a rear surface of the same (inner side) as indicated by an arrow z.

As described above, the phase modulation element 1 has a phase distribution based on the phase modulation unit (cell) 21 having an optically smaller size than the radius R/2 of the point spread distribution range R of the image formation optical system 3. Therefore, by appropriately changing the area shares of the first area 21a and the second area 21b in each phase modulation unit 21, i.e., a sum of the two phase vectors, the light intensity distribution formed on the processed substrate 4 (see FIG. 1) can be controlled by using a predetermined calculation. The phase modulation element 1 having the first and second phase values φ1 and φ2 can be manufactured by selecting a thickness of, e.g., a quarts glass so as to form the first and second phase values φ1 and φ2. A change in thickness of the quartz glass can be formed by selective etching or an FIB (Focused Ion Beam).

Figure 7:
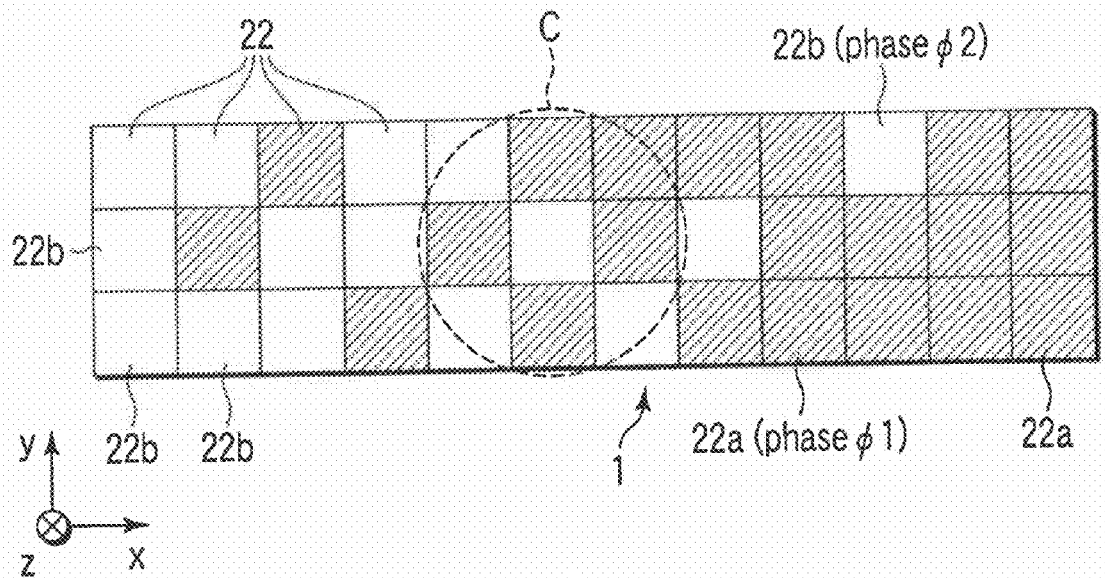
FIG. 7 is a schematic view illustrating another embodiment of the phase modulation element according to the present invention.

FIG. 7 is a view schematically showing another embodiment of the phase modulation element 1.

Referring to FIG. 7, the phase modulation element 1 has a plurality of rectangular pixels 22 each of which is optically smaller than the radius R/2 of the point spread distribution range R of the image formation optical system 3. The plurality of pixels 22 are closely arranged in the both vertical and horizontal directions, and each pixel 22 has a fixed phase value. Specifically, the phase modulation element 1 has shaded first pixels 22a each having a first phase value φ1 (e.g., 90 degrees) and non-shaded second pixels each of which is shown as a space and has a second phase value φ2 (e.g., zero degree). The incident light beams on the phase modulation element 1 are transmitted from a front surface of a paper sheet (front side) in a rear surface direction (inner side) as indicated by an arrow z.

As shown in FIG. 7, the number of pixels having the same phase value per unit range (indicated by a circle C of a broken line) optically corresponding to the point spread distribution range R (see FIG. 3B) of the image formation optical system 3 is changed in accordance with each unit range. In other words, the phase modulation element 1 shown in FIG. 7 has a phase distribution that the area shares of each first pixel 22a as a first area having the phase value φ1 and each second pixel 22b as a second area having the phase value φ2 vary depending on each position like the phase modulation element shown in FIG. 6A.

As described above, the phase modulation element 1 shown in FIG. 7 has a phase distribution based on the phase modulation unit (pixel) 22 having a size optically smaller than the radius R/2 of the point spread distribution range R of the image formation optical system 3. Therefore, by appropriately changing the area shares of the first pixels 22a and the second pixels 22b in a unit range C in the phase modulation element 1 optically corresponding to the point spread distribution range R of the image formation optical system 3, i.e., a sum of phase vectors, a light intensity distribution formed on the processed substrate 4 can be controlled by using a predetermined calculation.

Figure 8:
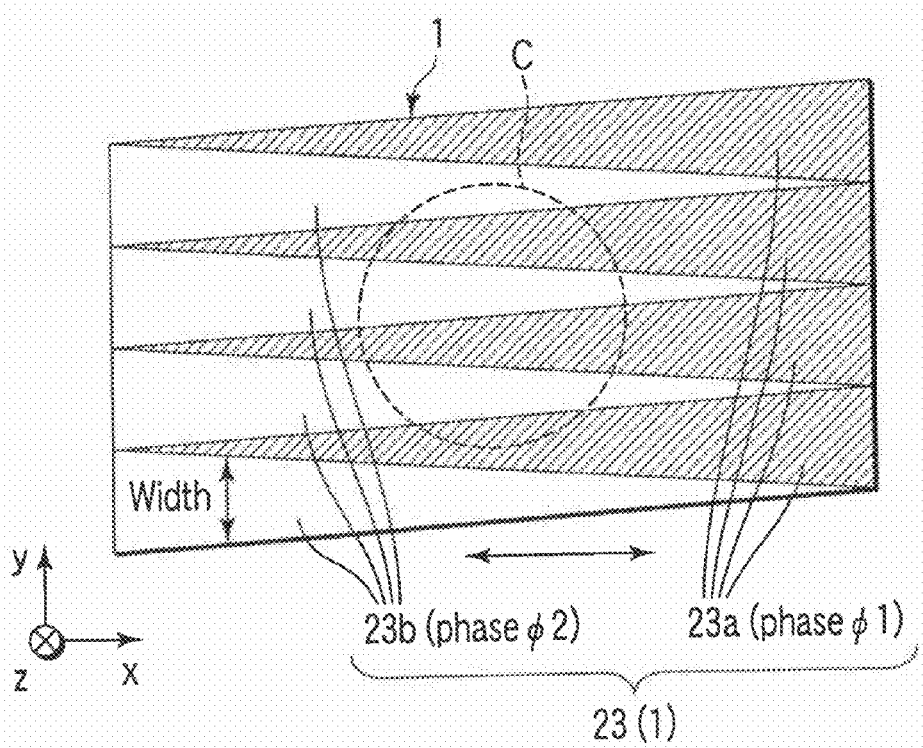
FIG. 8 is a schematic view illustrating still another embodiment of the phase modulation element according to the present invention.

FIG. 8 is a view schematically showing still another embodiment of the phase modulation element 1. Referring to FIG. 8, the phase modulation element 1 has a plurality of stripe-like areas 23 defined by elongated triangle shapes each having an optically smaller width than a radius of the unit range C corresponding to the point spread distribution range R of the image formation optical system 3. The plurality of stripe-like areas 23 are closely arranged as shown in the drawing, and each stripe-like area 23 has a fixed phase value.

Specifically, the phase modulation element 1 has each shaded first stripe-like area 23a having a first phase value φ1 (e.g., 90 degrees) and each non-shaded second stripe-like area 23b which is shown as a space and has a second phase value φ2 (e.g., zero degree).

As shown in FIG. 8, a width of each stripe-like area 23a or 23b varies along the longitudinal direction (indicated by an arrow x). In other words, there is a phase distribution that area shares of the first stripe-like area 23a as a first area having the phase value φ1 and the second stripe-like area 23b as a second area having the phase value φ2 vary depending on each position.

The incident light beams on the phase modulation element 1 are transmitted from a front surface of a paper sheet (front side) in a direction of a rear surface (inner side) of the same in FIG. 8 as indicated by an arrow z. This phase modulation element 1 can be manufactured by selecting a thickness of, e.g., a quartz glass so as to form the first and second phase values φ1 and φ2. A change in thickness of the quartz glass can be formed by selective etching or an FIB.

As described above, the phase modulation element 1 shown in FIG. 8 has the phase distribution based on the phase modulation unit (stripe-like area) having an optically smaller width than the radius R/2 of the point spread distribution range R of the image formation optical system 3. Therefore, by appropriately changing the area shares of the first stripe-like area 23a and the second stripe-like area 23b in a unit range C optically corresponding to the point spread distribution range R of the image formation optical system 3, i.e., a sum of a plurality of phase vectors, a light intensity distribution formed on the processed substrate 4 can be controlled by using a predetermined calculation.

Figure 9A:
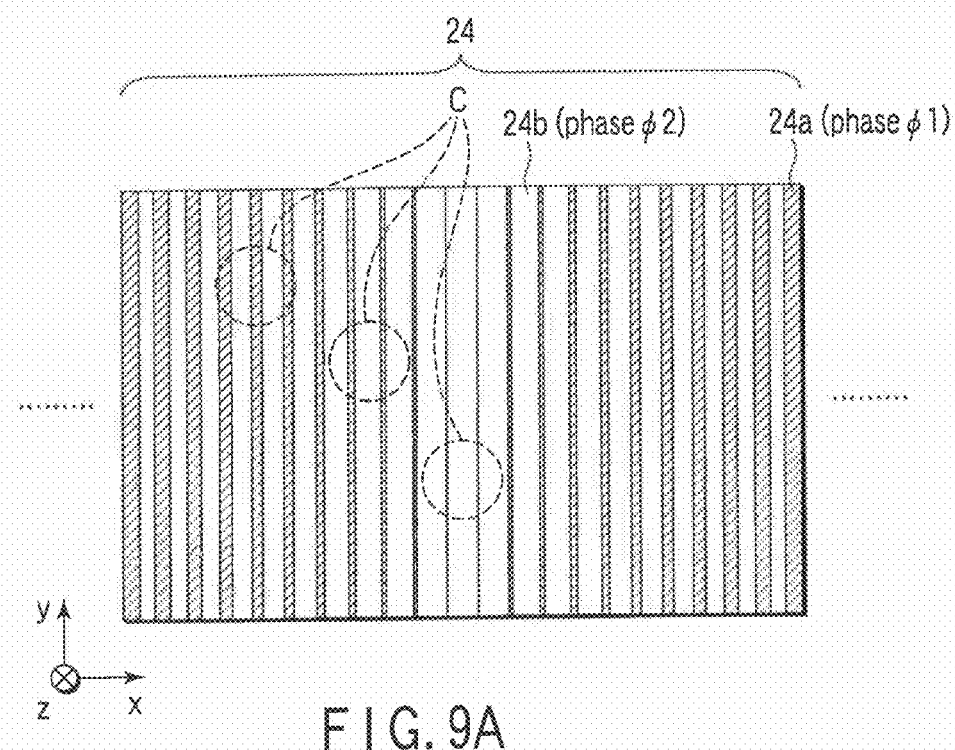
FIG. 9A is a schematic view illustrating yet another embodiment of the phase modulation element according to the present invention.

FIG. 9A is a view schematically showing yet another embodiment of the phase modulation element 1. Referring to FIG. 9A, the phase modulation element 1 has a line-and-space pattern 24 having an optically smaller width than a radius of the point spread distribution range R (see FIGS. 3B and 7, which is indicated by "C" in FIG. 9A) of the image formation optical system 3. Incidentally, when this pattern is simply referred to as the line-and-space pattern, it generally means a set of a transmission area and a non-transmission area. However, in the present invention, it is notated as the line and space with respect to a repetition of two different types of phases.

In FIG. 9A, each shaded line portion 24a has a first phase value φ1 (e.g., 90 degrees), and each non-shaded space portion 24b shown as a space has a second phase value φ2 (e.g., zero degree). When a pitch is indicated with a ratio of a width of the line portion 24a and a width of the space portion 24b which are adjacent to each other, i.e., a part corresponding to the first phase value φ1 and a part corresponding to the second phase value φ2 being regarded as a set, a percentage of the first phase value φ1 in each pitch varies along a direction indicated by an arrow x.

Specifically, a duty ratio (width of the line portion 24a/pitch) is 0% at the center of the line-and-space pattern 24, the duty ratio is linearly increased in increments of 5% toward a periphery, and the duty ratio is 50% on the both sides. As described above, the phase modulation element shown in FIG. 9A has a phase distribution that area shares of the line portion 24a as a first area having the phase value φ1 and the space portion 24b as a second area having the phase value φ2 vary depending on each position like the embodiment of the phase modulation element described above.

As mentioned above, the phase modulation element 1 shown in FIG. 9A has the phase distribution based on a phase modulation unit (the line portion or the space portion) C having an optically smaller width than the radius R/2 of the point spread distribution range R of the image formation optical system 3. Therefore, by appropriately changing the area shares of the line portion 24a and the space portion 24b in the unit range C optically corresponding to the point spread distribution range R of the image formation optical system 3, i.e., a sum of a plurality of phase vectors, a light intensity distribution formed on the processed substrate 4 (see FIG. 1) can be controlled by using a predetermined calculation.

Specifically, as shown in FIG. 9A, a part in the vicinity of the center in the longitudinal (arrow x) direction is determined to substantially have the second phase value φ2, and the line-and-space pattern 24 is formed in such a manner that a ratio of the area having the first phase value φ1 is gradually increased toward the both end portions in a direction indicated by the arrow x. In this case, the incident light beams which are transmitted from a front surface (front side) of a paper sheet in a direction of a rear surface (inner side) of the same as indicated by an arrow z demonstrate a light intensity distribution with a convex pattern that a light intensity becomes largest at the central position corresponding to the center of the line-and-space pattern 24 and the light intensity becomes smallest at positions on both sides corresponding to the both sides of the line-and-space pattern 24 as shown in FIG. 9B.

Actually, since the line-and-space pattern 24 is repeatedly formed along the both sides in the direction indicated by the arrow, there is obtained a light intensity distribution with a concave pattern that the light intensity is minimum at the center and the light intensity is one-dimensionally and substantially linearly increased toward the periphery, i.e., a light intensity distribution with a V-shaped (an alphabetical letter [V] and an inverted [V] are alternately arranged in zigzags) pattern. This phase modulation element 1 can be manufactured by selecting a thickness of, e.g., a quartz glass so as to form the first and second phase values φ1 and φ2. A change in thickness of the quartz glass can be formed by selective etching or an FIB. Incidentally, in order to obtain an accurately linear light intensity distribution such as shown in FIG. 9B, it is desirable for the areas 24a and 24b having the different phase values to use a duty ratio (width of the line portion 24a/pitch) which is obtained in accordance with the expression (1) and non-linearly increased (e.g., six steps of 0%, 5%, 11%, 18%, 28% and 50%) in place of using a duty ratio which is linearly increased as described above.

Figure 9B:
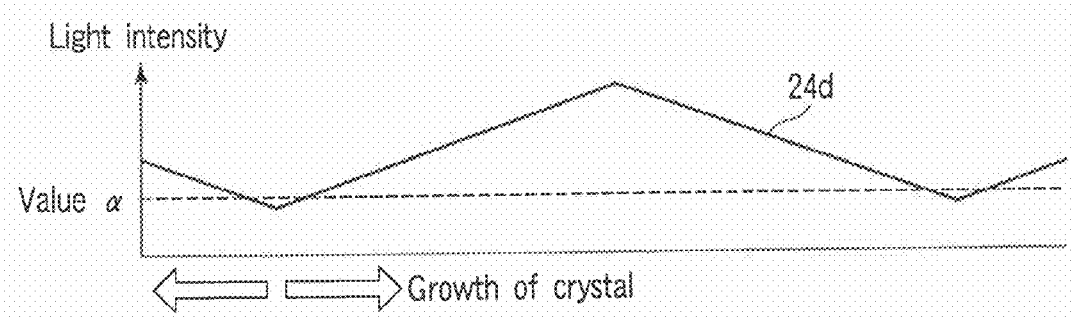
FIG. 9B is a schematic view showing a light intensity distribution provided by the phase modulation element depicted in FIG. 9A.

Meanwhile, when the processed substrate 4 is irradiated with laser beams having a light intensity with such a concave pattern as shown in FIG. 9B, there is known a fact that a crystal nucleus is generated at a position on the processed substrate 4 substantially corresponding to a bottom portion (part where the light intensity is minimum) of the light intensity distribution. That is, a growth of a crystal (increase in particle size) which is a change from an amorphia to a crystal advances along a temperature gradient from the crystal nucleus toward the periphery. At a part where the light intensity of the laser beams with which the processed substrate 4 is irradiated is not more than a threshold value α, the semiconductor film (Si) is not fused (remains as an amorphous material), or a surface thereof is partially fused and the semiconductor film remains in a silicon state (no crystal growth), and the crystal growth starts when the threshold value α is exceeded.

Therefore, in order to obtain a crystal with a large particle size which is as large as possible by adopting the light intensity distribution with the concave pattern, it is desirable that a value of the light intensity at the bottom of the light intensity distribution with the concave pattern is slightly lower than this value α. In other words, it is desirable that the value α used to obtain the crystal with a large particle size has the light intensity slightly larger than a bottom value of the light intensity distribution with the concave pattern. That is, the crystal is caused to grow in the lateral direction from the crystal nucleus by using the phase modulation element 1 shown in FIG. 9A to minimize the light intensity at a preset arbitrary position (form a bottom portion of the light intensity distribution) as shown in FIG. 9B and using the light intensity distribution with a pattern which increases the light intensity from the bottom portion toward the periphery in the light intensity distribution, thereby generating a crystallized semiconductor film with a large particle size.

In particular, since the temperature gradient toward the periphery also becomes linear in the light intensity distribution with a V-shaped pattern that the light intensity is linearly increased toward the periphery among the concave patterns, the growth of the crystal does not stop, and a crystallized semiconductor film with a larger particle size can be generated. Furthermore, since an additional irregular light intensity distribution is not produced as different from the prior art using the phase shifter as shown in FIG. 9B, crystal grains can be generated in an array form with a high filling ratio by using the light intensity distribution with the above-described pattern.

It is to be noted that the light intensity distribution 24d having a concave pattern similar to the V-shaped pattern shown in FIG. 9B is not restricted to one axial direction and can be provided in an arbitrary direction by repeating the phase distribution shown in FIGS. 6A, 7 and 8 along a predetermined direction (direction along which area shares vary). As a result, causing the lateral growth of the crystal from the crystal nucleus based on the light intensity distribution 24d having the same concave pattern as that shown in FIG. 9B can likewise generate a crystallized semiconductor film with a large particle size by using the phase modulation element depicted in FIGS. 6A, 7 and 8.

Figures 9C, 9D:
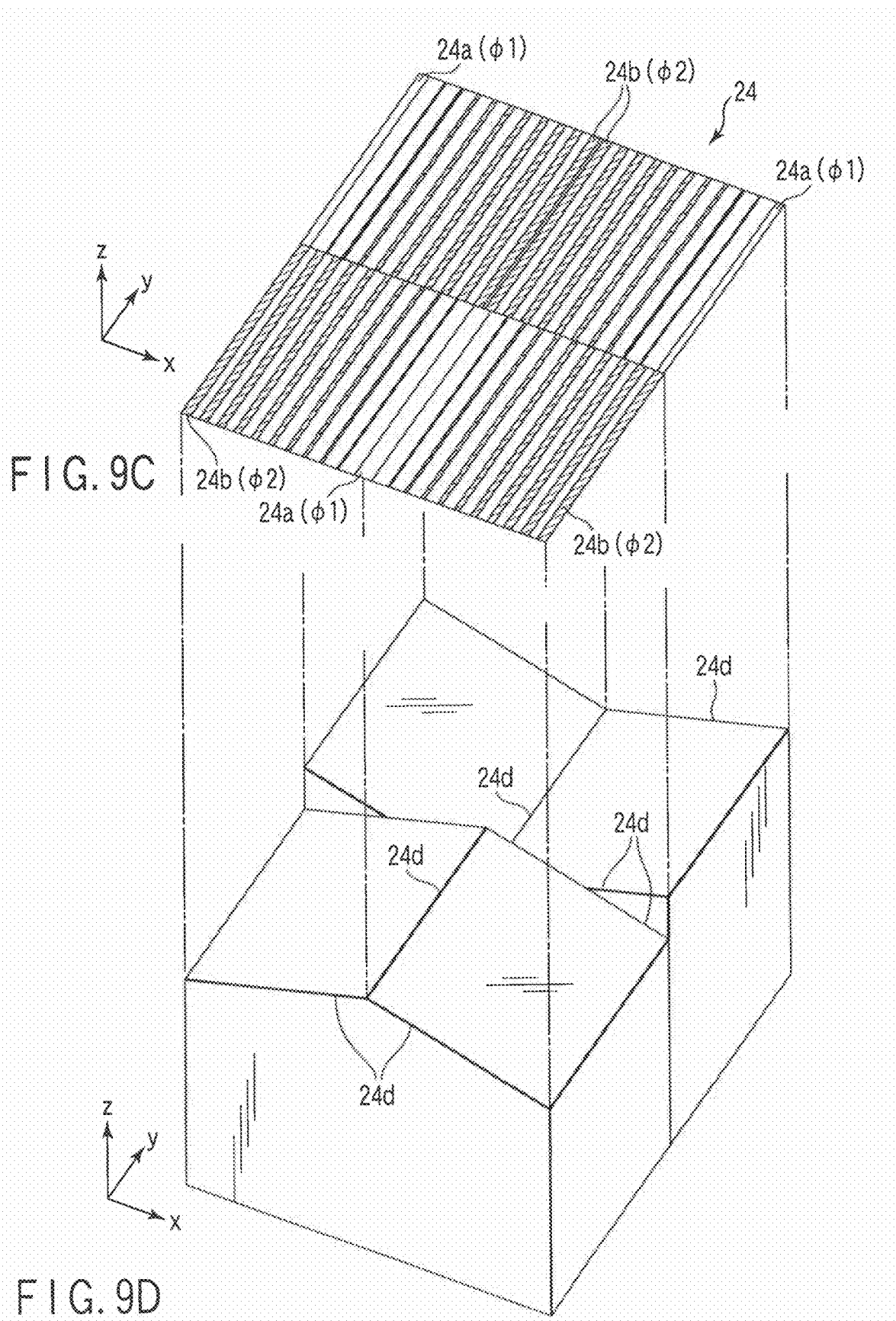
FIG. 9C is a schematic view illustrating an example that the phase modulation element depicted in FIG. 9A is also arranged in a direction indicated by an arrow y orthogonal to a direction indicated by an arrow x.
FIG. 9D is a schematic view showing a light intensity distribution provided by the phase modulation element illustrated in FIG. 9C.

As shown in FIG. 9C, it is to be noted that such a light intensity distribution to which an irregular distribution is given in a plane direction as shown in FIG. 9C can be obtained by offsetting a position of the phase value φ2 by a predetermined quantity in a direction indicated by an arrow y orthogonal to a direction indicated by an arrow x in order to provide a matrix form to the phase modulation element shown in FIG. 9A. Moreover, in such a matrix type phase modulation element as shown in FIG. 9C, a size of one side of a phase modulation element block as a unit is, e.g., 10 μm in the direction indicated by the arrow x and 5 μm in the direction indicated by the arrow y.

Figure 10A:
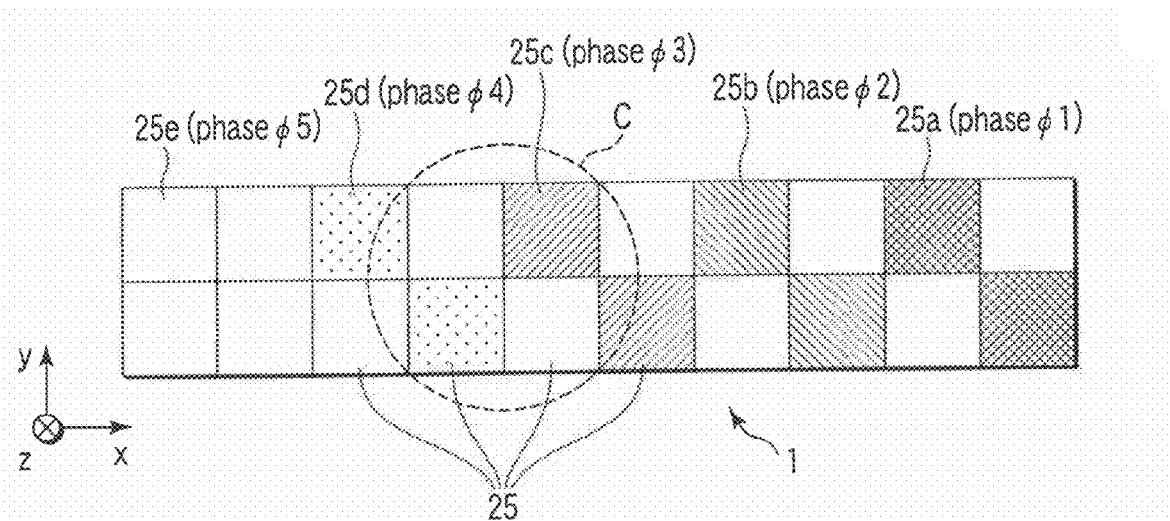
FIG. 10A is a schematic view illustrating a further embodiment of the phase modulation element according to the present invention.

FIG. 10A is a view schematically showing a further structure of the phase modulation element according to the present invention. Referring to FIG. 10A, the phase modulation element 1 has a plurality of rectangular pixels 25 each of which is optically smaller than the radius R/2 of the point spread distribution range R (i.e., a unit range C) of the image formation optical system 3. The plurality of pixels 25 are closely arranged in the both vertical and horizontal direction, each pixel 25 has a fixed phase value, and the phase value varies in accordance with each pixel 25. In other words, the phase modulation element 1 shown in FIG. 10A has a cyclic divided area structure, each divided area (pixel) 25 has a fixed phase value, and the phase modulation element 1 has a phase distribution that the phase value varies in accordance with each divided area.

Figure 10B:
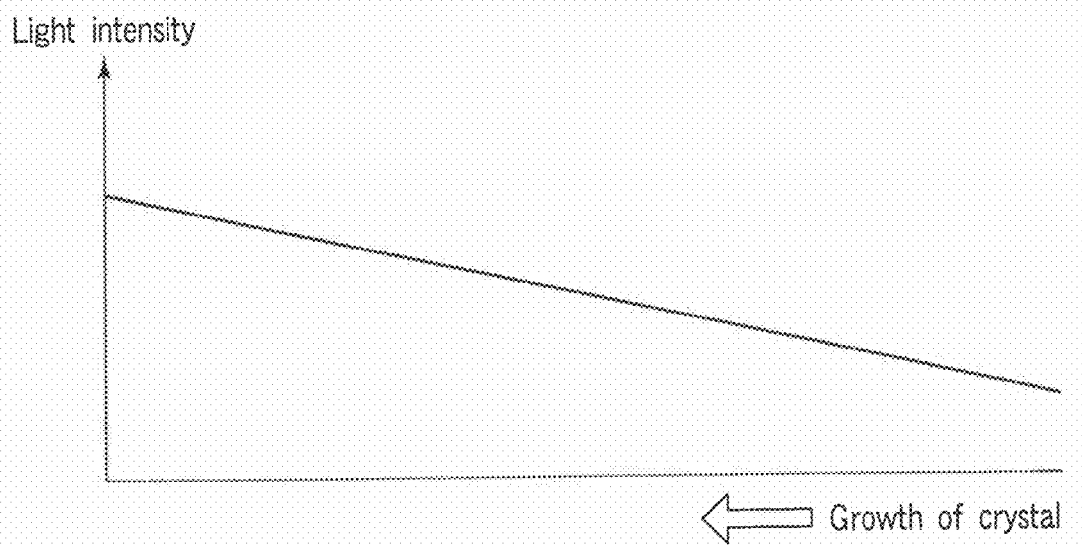
FIG. 10B is a schematic view showing a light intensity distribution provided by the phase modulation element depicted in FIG. 10A.

Specifically, the phase modulation element 1 has a first pixel 25a with a first phase value $\phi 1$ (e.g., 90 degrees), a second pixel 25b with a second phase value $\phi 2$ (e.g., 67.5 degrees), a third pixel 25c with a third phase value $\phi 3$ (e.g., 45 degrees), a fourth pixel 25d with a fourth phase value $\phi 4$ (e.g., 22.5 degrees), and a fifth pixel 25e with a fifth phase value $\phi 5$ (e.g., zero degree). Additionally, pixels other than the first to fifth pixels 25a to 25e have the same phase value (e.g., zero degree). That is, in the phase modulation element 1 shown in FIG. 10A, a change quantity of the phase value is small in an area on the fifth pixel 25e side having the fifth phase value $\phi 5$ given thereto, a change quantity of the phase value is large in an area on the first pixel 25a side having the first phase value $\phi 1$ given thereto, and a change quantity of the phase value monotonously varies between these areas. Therefore, as indicated by an arrow z, a light intensity of the light beams transmitted through the phase modulation element 1 from a front surface (front side) of a paper sheet in a direction of a rear surface (inner side) of the same is larger on the fifth pixel 25e side than the first pixel 25a side as shown in FIG. 10B.

As described above, the phase modulation element 1 has a phase distribution based on a phase modulation unit (pixel) 25 having an optically smaller size than the radius R/2 of the point spread distribution range R (unit range C) of the image formation optical system 3. Further, by appropriately changing the distribution of the phase values, i.e., a sum of a plurality of phase vectors, a light intensity distribution formed on the processed substrate 4 can be controlled by using a predetermined distribution. This phase modulation element 1 can be manufactured by selecting a thickness of, e.g., a quartz glass so as to form a desired phase value distribution. A change in thickness of the quartz glass can be formed by selective etching or an FIB.

It is to be noted that repeating the phase distribution shown in FIG. 10A in a direction along which the phase value varies can provide a light intensity distribution similar to the V-shaped (an alphabetical letter [V] and an inverted [V] are alternately arranged in zigzags) pattern shown in FIG. 9B. As a result, the sufficient lateral growth of the crystal from a crystal nucleus can be realized based on the light intensity distribution with the concave pattern, thereby generating a crystallized semiconductor film with a large particle size.

Figure 11A:
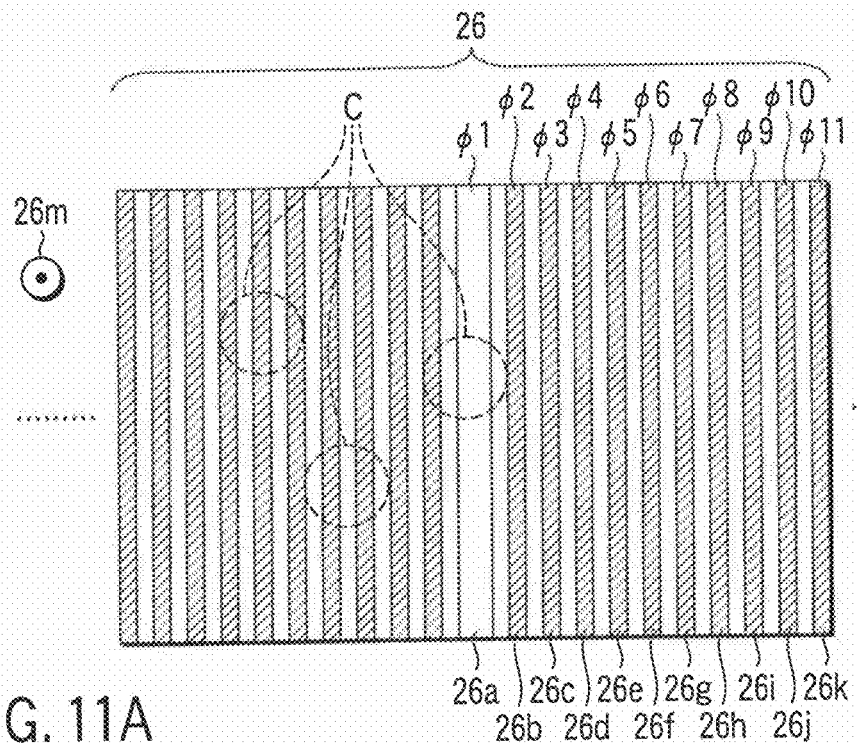
FIG. 11A is a schematic view illustrating a still further embodiment of the phase modulation element according to the present invention.

FIG. 11A is a view schematically showing a still further structure of the phase modulation element according to the present invention. Referring to FIG. 11A, the phase modulation element 1 has a line-and-space pattern 26 having an optically smaller width than the radius R/2 of the point spread distribution range R (unit range C) of the image formation optical system 3. Here, a duty ratio (width of a line portion/pitch) is 50% and fixed over the entire line-and-space pattern 26. However, a phase value of each shaded line portion varies in accordance with each line portion.

That is, a phase value $\phi 1$ of the line portion 26a is closest to a phase of the space portion at the center of the line-and-space pattern 26, a phase value $\phi 11$ of each line portion 26k on the both sides is farthest from the phase of the space portion, and the phase value of the line portion monotonously varies between these values. The phase value in each space portion of the line-and-space pattern 26 is fixed. Specifically, a phase value $\phi 1$ of a line portion 26a is zero degree, a phase value $\phi 2$ of a line portion 26b is 25.9 degrees, a phase value $\phi 3$ of a line portion 26c is 36.9 degrees, a phase value $\phi 4$ of a line portion 26d is 45.6 degrees, a phase value $\phi 5$ of a line portion 26e is 53.2 degrees, and a phase value $\phi 6$ of a line portion 26f is 60.0 degrees.

Furthermore, a phase value $\phi 7$ of a line portion 26g is 66.5 degrees, a phase value $\phi 8$ of a line portion 26h is 72.6 degrees, a phase value $\phi 9$ of a line portion 26i is 78.5 degrees, a phase value $\phi 10$ of a line portion 26j is 84.3 degrees, and a phase value $\phi 11$ of a line portion 26k is 90.0 degrees. On the other hand, phase values of the respective space portions are all zero degree. In this manner, the phase modulation element 1 has a cyclic divided area structure, each divided area (the line portion or the space portion) has a fixed phase value, and the phase modulation element 1 has a phase distribution that the phase value varies in accordance with each divided area.

As described above, the phase modulation element 1 has a phase distribution based on a phase modulation unit (the line portion or the space portion) having an optically smaller width than the radius R/2 of the point spread distribution range R of the image formation optical system 3. Therefore, by appropriately changing a distribution of the phase values of the line portions in an optically smaller unit range than the point spread distribution range R of the image formation optical system 3, i.e., a sum of a plurality of phase vectors, a light intensity distribution formed on the processed substrate 4 (see FIG. 4) can be controlled by using a predetermined calculation. The incident light beams onto the phase modulation element 1 are transmitted from a front surface (front side) of a paper sheet in a direction of a rear surface (inner side) of the same as indicated by an arrow z in FIG. 11A. This phase modulation element 1 can be readily manufactured by selecting a thickness of, e.g., a quartz glass so as to form a desired phase value distribution. A change in thickness of the quartz glass can be formed by selective etching or an FIB.

Figure 11B:
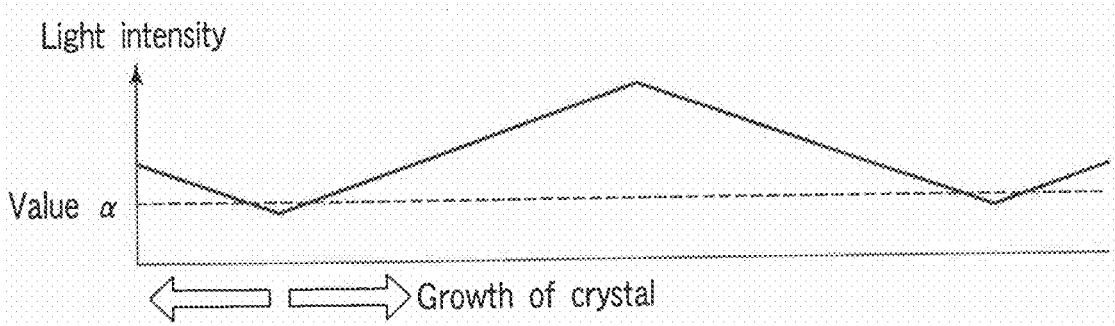
FIG. 11B is a schematic view showing a light intensity distribution provided by the phase modulation element depicted in FIG. 11A.

Further, repeating the phase distribution shown in FIG. 11A along a predetermined direction (direction along which the phase value varies) can obtain a light intensity distribution with a concave pattern shown in FIG. 11B which is similar to the V-shaped pattern depicted in FIG. 9B, thereby forming crystal grains in an array form. As a result, the sufficient lateral growth from a crystal nucleus of a crystal can be realized based on the light intensity distribution with the concave pattern shown in FIG. 11A, thus generating a crystallized semiconductor film with a large particle size.

FIG. 12A is a schematic view illustrating a yet further embodiment of the phase modulation element according to the present invention. Referring to FIG. 12A, the phase modulation element 1 has a first stripe-like area 31 which has a first phase distribution and extends along a direction indicated by an arrow x which is a direction along which a phase varies, and a second stripe-like area 32 which has a second phase distribution and extends along the direction indicated by the arrow x in substantially parallel with the first stripe-like area 31 which is the direction along the phase varies. The first stripe-like area 31 an the second stripe-like area 32 are adjacent to each other with a border line 33 in the phase change direction therebetween, and an average phase value on the first stripe-like area 31 side is substantially different from an average phase value on the second stripe-like area 32 side in a local area on the border line 33. It is to be noted that light intensity characteristics having a linear falling gradient in directions indicated by arrows 31x and 32x in FIG. 12A can be obtained based on, e.g., the phase distribution shown in FIG. 11A.

The first stripe-like area 31 and the second stripe-like area 32 are configured to have substantially the same light intensity distributions which are formed in accordance therewith. In a first local area 34 on the border line 33 corresponding to a part where the light intensity of the light intensity distribution is small, an average phase value on the first stripe-like area 31 side is substantially different from an average phase value on the second stripe-like area 32 side. On the other hand, in a second local area 35 on the border line 33 corresponding to a part where the light intensity of the light intensity distribution is large, an average phase value φave on the first stripe-like area 31 side is substantially equal to an average phase value φave on the second stripe-like area 32 side. The average phase value φave is represented by the following expression:

$$\phi ave = \int_D \phi(x,y) dx dy$$

D is an integration range, and it is, e.g., a range close to the center partitioned by the border line 33 in the point spread distribution range R. e(x, y) is a unit vector having a phase at coordinates (x, y), and arg is a function used for obtaining the phase from the vector.

The light beams transmitted through the phase distribution pattern shown in FIG. 12A demonstrate a light intensity distribution 120 with a concave pattern having, e.g., a V-shaped (an alphabetical letter [V] and an inverted [V] are alternately arranged in zigzags) conformation along the phase change direction in each of the first stripe-like area 31 and the second stripe-like area 32 sufficiently distanced from the border line 33 as shown in FIG. 12B.

A light intensity distribution along the border line 33 shown in FIG. 12C produces a drop 121 in a light intensity with an inverse peak pattern corresponding to a part where the light intensity is small in an area corresponding to the first local area 34 as described above in connection with FIGS. 3B to 3F since the average phase value on the first stripe-like area 31 side is substantially different from the average phase value on the second stripe-like area 32 side in the first local area 34 on the border line 33.

However, since the average phase value on the first stripe-like area 31 side is substantially equal to the average phase value on the second stripe-like area 32 side in the second local area 35 on the border line 33, the affect by the second local area 35 is rarely produced in a part where the light intensity is large.

In the phase modulation element having the phase pattern shown in FIG. 12A, there is obtained a combined light intensity distribution of the light intensity distribution 120 with the concave pattern having, e.g., the V-shaped (an alphabetical letter [V] and an inverted [V] are alternately arranged in zigzags) conformation and the light intensity distribution with the inverse peak pattern 121 including a part where the light intensity is locally small in this light intensity distribution 120 with the concave pattern, i.e., a light intensity distribution with the concave pattern 120 and the inverse peak pattern locally including a part where the light intensity is locally small.

In the light intensity distribution with the concave pattern and the inverse peak pattern including the part where the light intensity is locally small, it is desirable to set the value α described with reference to FIG. 9B so as to be positioned in the vicinity of the border between the light intensity distribution 121 with the inverse peak pattern and the light intensity distribution 120 with the concave pattern or on the inner side of the light intensity distribution 121 with the inverse peak pattern (to the side where the light intensity is low). By setting the position where the light intensity has the value α to the above-described position (see FIG. 12A), a start point of the crystal growth can be caused to approximate the center of the light intensity distribution 120 with the concave pattern including the inverse peak pattern as much as possible, thereby generating crystal grains with a large particle size.

Furthermore, a crystal nucleus formation position, i.e., a crystal generation position can be controlled to an arbitrary two-dimensional position by the effect of the inverse peak pattern 121. The incident light beams onto the phase modulation element 1 are transmitted from a front surface (front side) of a paper sheet in a direction of a rear surface (inner side) of the same as indicated by an arrow z in FIG. 12A. This phase modulation element 1 can be manufactured by selecting a thickness of, e.g., a quartz glass so as to form a desired phase value distribution. A change in thickness of the quartz glass can be formed by selective etching or an FIB.

Figure 13:
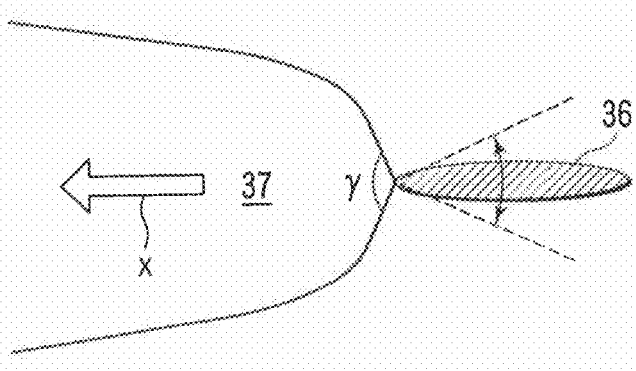
FIG. 13 is a schematic view illustrating characteristics of the phase modulation element depicted in FIGS. 12A to 12C.

Moreover, in the phase modulation element having the phase pattern shown in FIG. 12A, the light intensity distribution 121 with the inverse peak pattern is formed at a position where the light intensity becomes minimum in the V-shaped (an alphabetical letter [V] and an inverted [V] are alternately arranged in zigzags) pattern as described with reference to FIG. 12C due to a phase difference between the two areas, i.e., a difference between the average phase value on the first stripe-like area 31 side and the average phase value on the second stripe-like area 32 side in the first local area 34 on the border line 33. Since the first local area 13 is linear, a low-light intensity area 36 formed on the processed substrate 4 has an acute edge angle, as shown in FIG. 13. With this structure, crystal grains 37 can be easily generated in a very wide range. This phenomenon is common to all phase modulation elements whose border lines are based on the difference in average phase values.

Figure 14A:
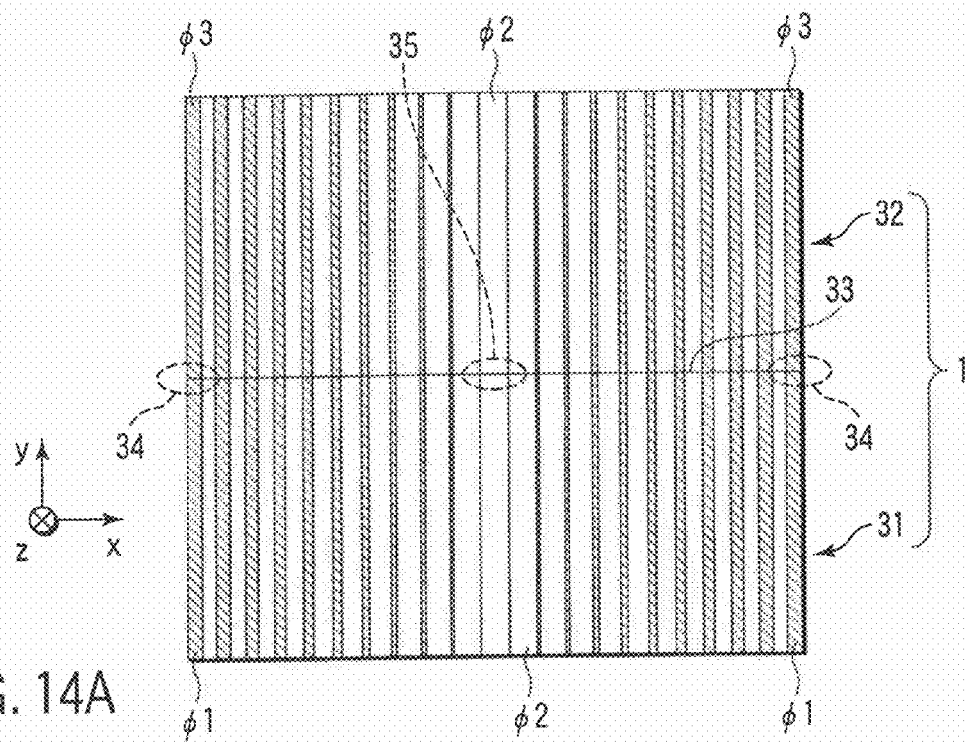
FIG. 14A is a schematic view illustrating another embodiment of the phase modulation element according to the present invention.

FIG. 14A is a view schematically showing another structure of the phase modulation element according to the present invention. Referring to FIG. 14A, even in both a line-and-space pattern constituting a first stripe-like area 31 of the phase modulation element 1 and a line-and-space pattern constituting a second stripe-like area 32 of the same, a duty ratio (width of a line portion/pitch) is 0% at the center, the duty ratio is linearly increased in increments of 5% toward the right-and-left peripheral direction, and the duty ratio is 50% (a total of 11 steps) on the both sides. It is to be noted that a size of one side of a phase modulation element block as a unit in the phase modulation element shown in FIG. 14A is, e.g., 10 μm in a direction indicated by an arrow x and 5 μm in a direction indicated by an arrow y in terms of values converted to the image formation surface.

In the line-and-space pattern of the first stripe-like area 31, each shaded line portion has a first phase value φ1 (e.g., 90 degrees) and each non-shaded space portion shown as a space has a second phase value φ2 (e.g., zero degree). On the other hand, the line-and-space pattern of the second stripe-like area 32 is a phase distribution that each shaded line portion has a third phase value φ3 (e.g., −90 degrees) and each non-shaded space portion shown as a space has a second phase value φ2 (e.g., zero degree).

Figure 14B:
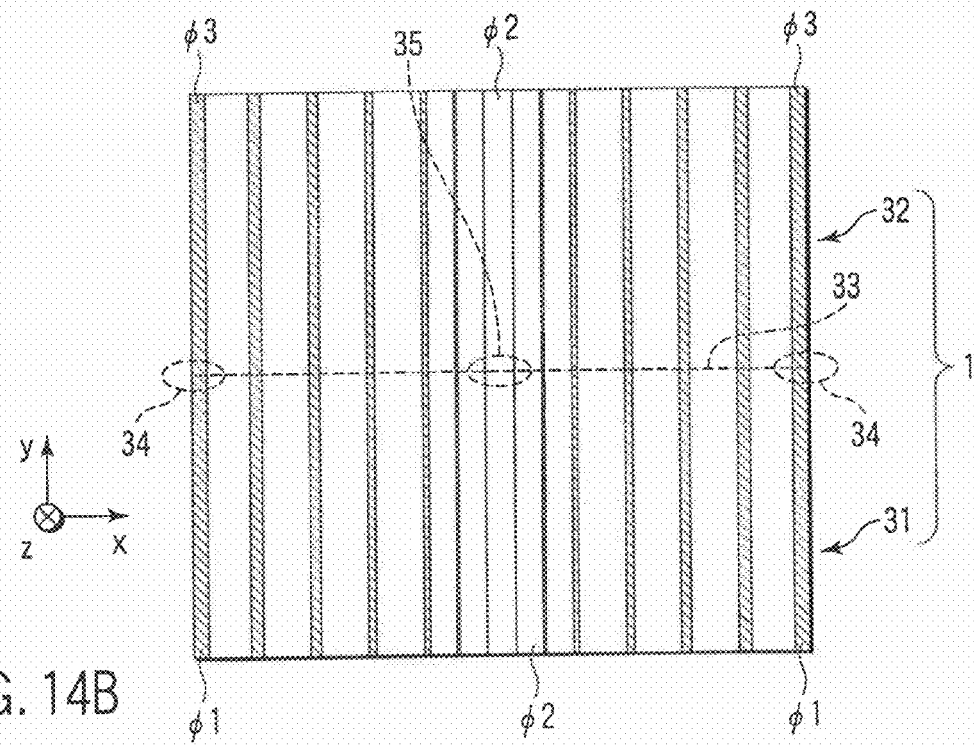
FIG. 14B is a schematic view illustrating a modification of the phase modulation element depicted in FIG. 14A.

That is, the phase modulation element 1 shown in FIGS. 14A and 14B has a structure that the first stripe-like area 31 that a superficial content of an area having a phase value of 90° is gradually increased from the center along the arrow x and the second stripe-like area 32 that a superficial content of an area having a phase value of −90° is gradually increased from the center along the arrow x are connected with each other along a border line 33.

In this manner, in the phase modulation element 1 shown in FIGS. 14A and 14B, the first stripe-like area 31 and the second stripe-like area 32 are configured to have substantially the same light intensity distributions which are formed in accordance therewith. In a first local area 34 on the border line 33 corresponding to a part where the light intensity of the light intensity distribution is small, an average phase value (e.g., approximately 45 degrees) on the first stripe-like area 31 side is substantially different from an average phase value (e.g., approximately −45 degrees) on the second stripe-like area 32 side. On the other hand, in a second local area 35 on the border line 33 corresponding to a part where the light intensity of the light intensity distribution is large, an average phase value (e.g., approximately zero degree) on the first stripe-like area 31 side is substantially equal to an average phase value (e.g., approximately zero degree) on the second stripe-like area 32 side. The incident light beams onto the phase modulation element 1 are transmitted from a front surface (front side) of a paper sheet in a direction of a rear surface (inner side) of the same as indicated by an arrow z in FIG. 14A. This phase modulation element 1 can be readily manufactured by selecting a thickness of, e.g., a quartz glass so as to form a desired phase value distribution. A change in thickness of the quartz glass can be formed by selective etching or an FIB.

As described above, according to the phase modulation element shown in FIGS. 14A and 14B, such a light intensity distribution with a concave pattern as shown in FIG. 14B can be obtained in a direction along which the phase varies in each of the first stripe-like area 31 and the second stripe-like area 32 sufficiently distanced from the border line 33 like the phase modulation element described in connection with FIG. 12A.

Figure 15A:
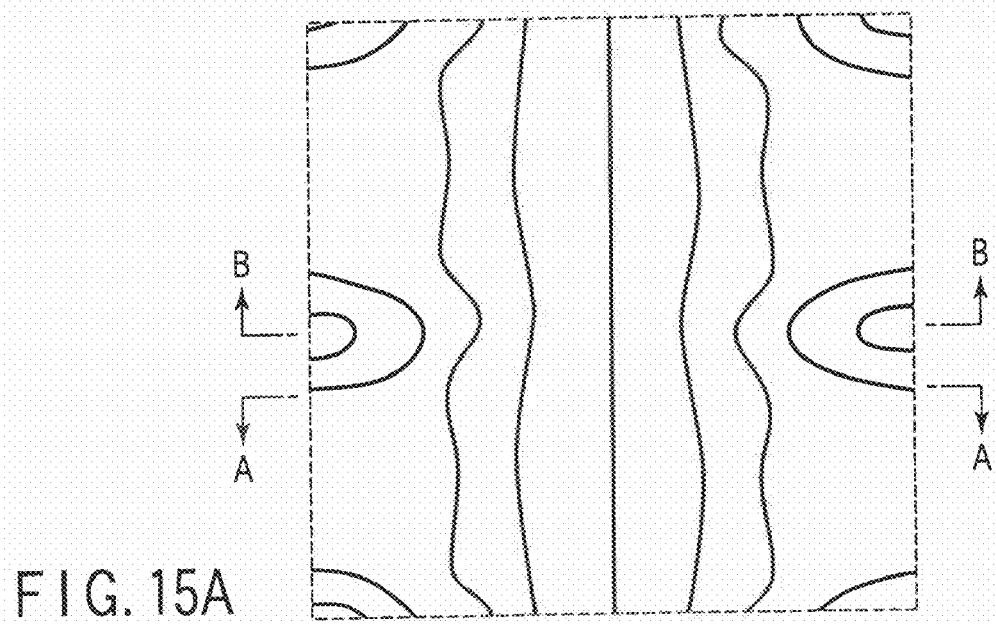
FIG. 15A is a schematic view showing in a contour map a light intensity distribution obtained in the phase modulation element depicted in FIG. 14A.
Figure 15B:
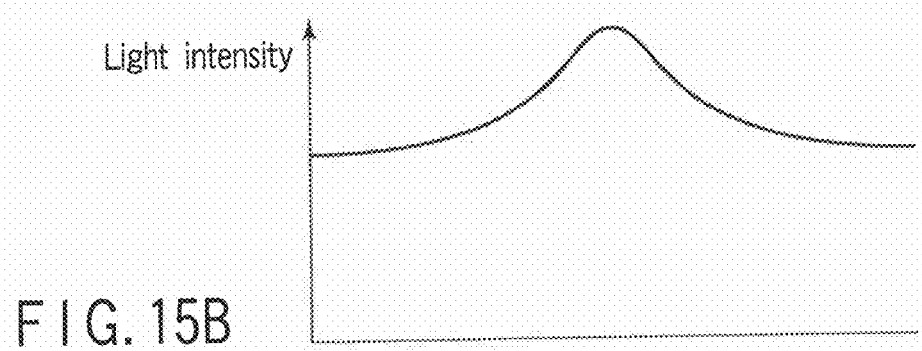
FIG. 15B is a schematic view showing a light intensity distribution along the line A-A in FIG. 15A.
Figure 15C:
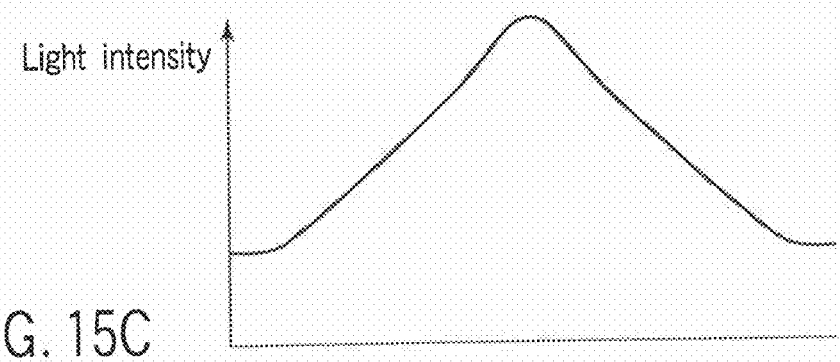
FIG. 15C is a schematic view showing a light intensity distribution along the border line B-B in FIG. 15A.

FIG. 15A is a schematic view showing in a contour map a light intensity distribution obtained in the phase modulation element depicted in FIG. 14A, FIG. 15B shows a light intensity distribution along the line A-A in FIG. 15A, and FIG. 15C shows a light intensity distribution along the border line B-B in FIG. 15A, respectively. It is to be noted that an image side numerical aperture NA of the image formation optical system 3 (see FIG. 3A) is set to 0.13 and an illumination sigma value (numerical aperture of the illumination system/object side numeral aperture of the image formation optical system 3) is set to 0.43.

Comparing the FIG. 15B light intensity distribution along the line A-A in FIG. 15A with the FIG. 15C light intensity distribution along the line B-B in FIG. 15A, it can be understood that a drop in light intensity which has an inverse peak pattern shape is formed at a part where the light intensity is small corresponding to a first local area 34. That is, it can be recognized that the light intensity distribution with a concave pattern suitable for crystallization and an inverse peak pattern that a light intensity is smaller than a threshold value α is actually obtained by irradiating the processed substrate with laser beams by using the phase modulation element having the phase value pattern shown in FIG. 14A.

Figure 16A:
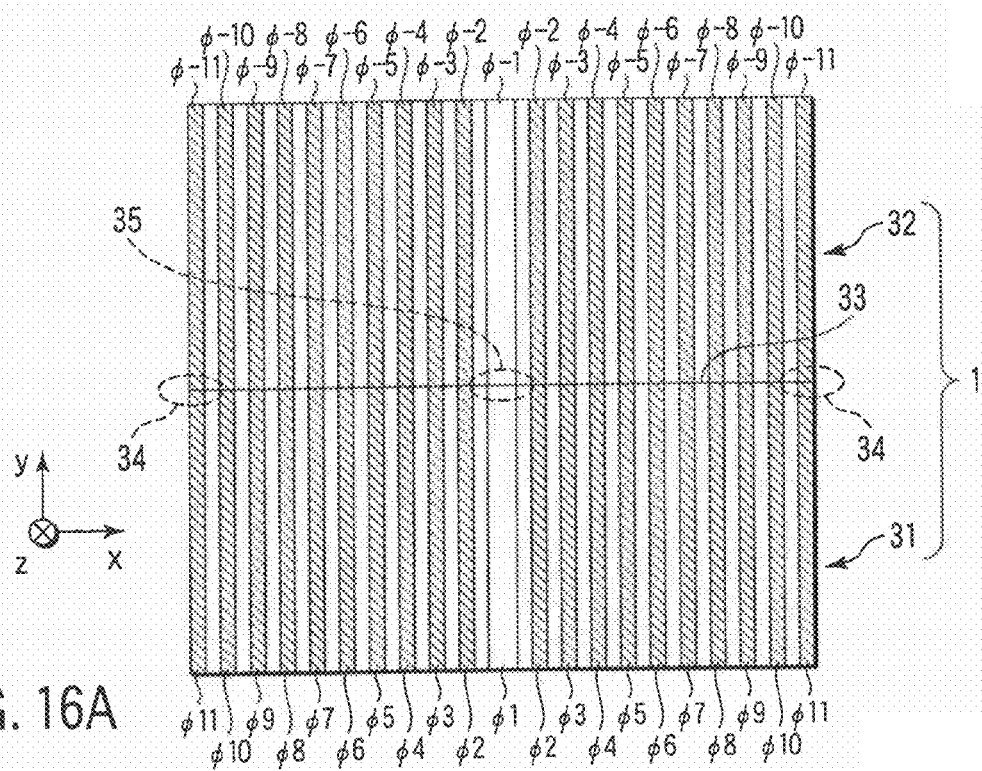
FIG. 16A is a schematic view illustrating still another embodiment of the phase modulation element according to the present invention.

FIG. 16A is a view schematically showing still another structure of the phase modulation element according to the present invention. Referring to FIG. 16A, even in both a line-and-space pattern constituting a first stripe-like area 31 of the phase modulation element 1 and a line-and-space pattern constituting a second stripe-like area 32 of the same, a duty ratio (width of a line portion/pitch) is 50% (a total of 11 steps) and fixed over the entire patterns.

In the line-and-space pattern of the first stripe-like area 31, a phase value φ1 of the line portion is closest to a phase of the space portion at the center thereof, a phase value φ11 of the line portion on each of the both sides is farthest from the phase of the space portion, and the phase value of the line portion monotonously varies between these areas. Specifically, the phase value φ1 is zero degree, a phase value φ2 is 25.9 degrees, a phase value φ3 is 36.9 degrees, a phase value φ4 is 45.6 degrees, a phase value φ5 is 53.2 degrees, a phase value φ6 is 60.0 degrees, a phase value φ7 is 66.5 degrees, a phase value φ8 is 72.6 degrees, a phase value φ9 is 78.5 degrees, a phase value φ10 is 84.3 degrees, and the phase value φ11 is 90.0 degrees.

On the other hand, in the line-and-space pattern of the second stripe-like area 32, a phase value φ-1 of the line portion is closest to a phase of the space portion at the center thereof, a phase value φ-11 of the line portion on each of the both sides is farthest from the phase of the space portion, and the phase value of the line portion monotonously varies between these areas. Specifically, the phase value φ-1 is zero degree, a phase value φ-2 is 25.9 degrees, a phase value φ-3 is 36.9 degrees, a phase value φ-4 is 45.6 degrees, a phase value φ-5 is 53.2 degrees, a phase value φ-6 is 60.0 degrees, a phase value φ-7 is 66.5 degrees, a phase value φ-8 is 72.6 degrees, a phase value φ-9 is 78.5 degrees, a phase value φ-10 is 84.3 degrees, and the phase value φ-11 is −90.0 degrees. However, both in the line-and-space pattern constituting the first stripe-like area 31 and the line-and-space pattern constituting the second stripe-like area 32, the phase values of the respective space portion are all zero degree.

It is to be noted that a size of one side of a phase modulation element block as a unit in the phase modulation element shown in FIG. 16A is, e.g., 10 μm in a direction indicated by an arrow x and 5 μm in a direction indicated by an arrow y in terms of values converted to the image formation surface.

Figure 16B:
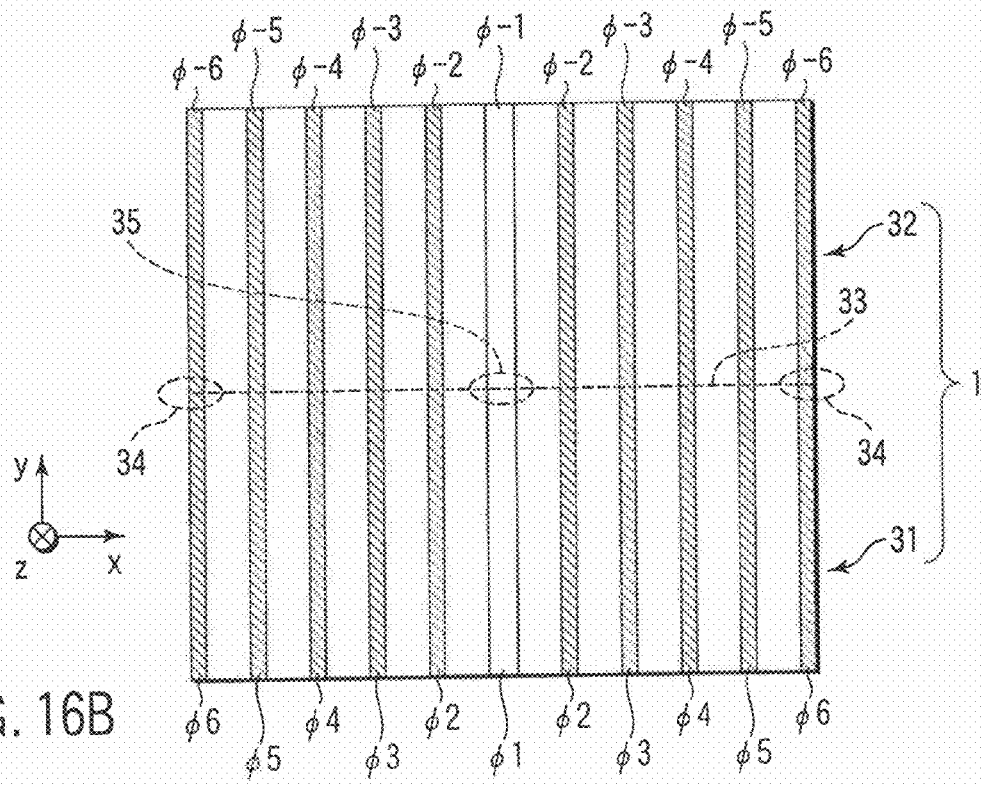
FIG. 16B is a schematic view illustrating a modification of the phase modulation element depicted in FIG. 16A.

In the phase modulation element shown in FIGS. 16A and 16B, the first stripe-like area 31 and the second stripe-like area 32 are configured to have substantially the same light intensity distributions which are formed in accordance therewith. In this phase modulation element, an average phase value (e.g., approximately 45 degrees) on the first stripe-like area 31 side is substantially different from an average phase value (e.g., approximately −45 degrees) on the second stripe-like area 32 side in a first local area 34 on a border line 33 corresponding to a part where the light intensity in the light intensity distribution is small. On the other hand, in a second local area 35 on the border line 33 corresponding to a part where the light intensity in the light intensity distribution is large, an average phase value (e.g., approximately zero degree) on the first stripe-like area 31 side is substantially equal to an average phase value (e.g., approximately zero degree) on the second stripe-like area 32 side. The light beams entering the phase modulation element 1 are transmitted from a front surface (front side) of a paper sheet in a direction of a rear surface (inner side) of the same as indicated by an arrow z in FIG. 16A. This phase modulation element 1 can be manufactured by selecting a thickness of, e.g., a quartz glass so as to form a desired phase value distribution. A change in thickness of the quartz glass can be formed by selective etching or an FIB.

As described above, according to the phase modulation element shown in FIGS. 16A and 16B, there is obtained such a light intensity distribution with a concave pattern as shown in FIG. 12B in a direction along which the phase varies in each of the first stripe-like area 31 and the second stripe-like area 32 sufficiently distanced from the border line 33 like the phase modulation element described above with reference to FIG. 12A. Moreover, a drop in light intensity which has an inverse peak pattern shape with a small light intensity corresponding to the first local area 34 is formed along the border line 33 as shown in FIG. 12C. As a result, it is possible to obtain the light intensity distribution with a concave pattern suitable for crystallization and an inverse peak pattern that the light intensity is smaller than a threshold value α.

Figure 17A:
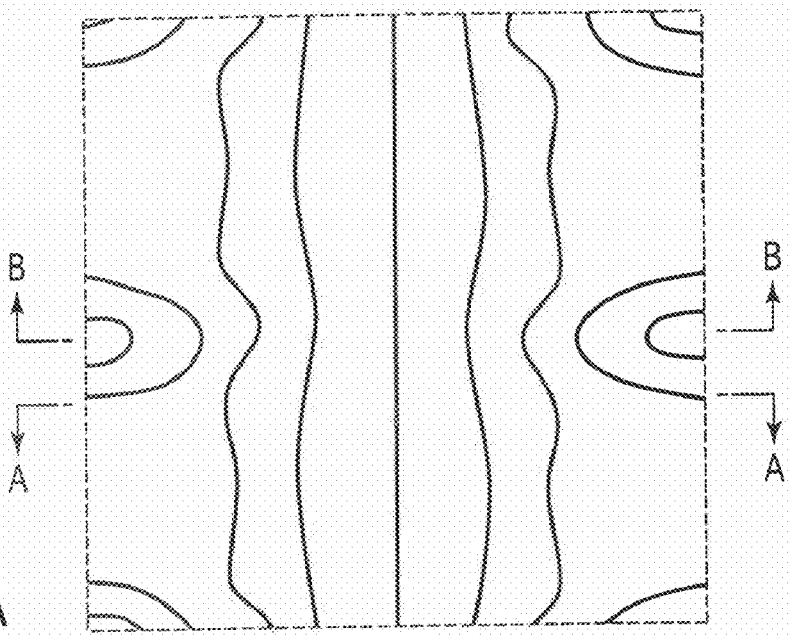
FIG. 17A is a schematic view showing in a contour map a light intensity distribution obtained in the phase modulation element depicted in FIG. 16A.
Figure 17B:
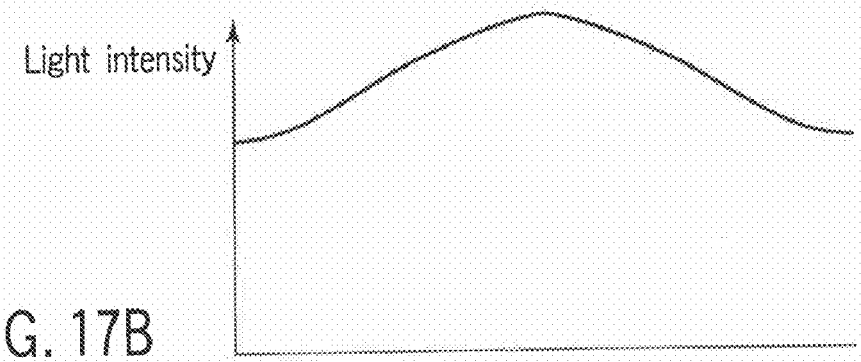
FIG. 17B is a schematic view showing a light intensity distribution along the line A-A in FIG. 17A.
Figure 17C:
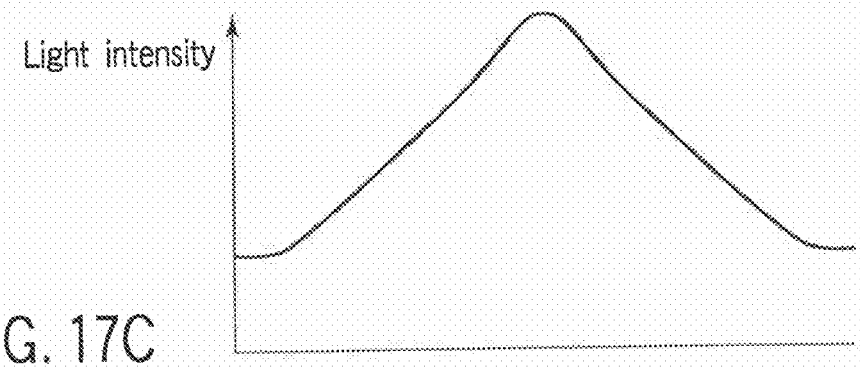
FIG. 17C is a schematic view showing a light intensity distribution along the border line B-B in FIG. 17A.

FIG. 17A shows in a contour map a light intensity distribution obtained in the phase modulation element depicted in FIG. 16A, FIG. 17B shows a light intensity distribution along the line A-A in FIG. 17A, and FIG. 17C shows a light intensity distribution along the line B-B in FIG. 17A, respectively. It is to be noted that an image side numerical aperture NA of the image formation optical system 3 is set to 0.13 and an illumination sigma value is set to 0.43.

Comparing the FIG. 17B light intensity distribution along the line A-A in FIG. 17A with the FIG. 17C light intensity distribution along the line B-B in FIG. 17A parallel with the border line 33, it can be understood that a drop in light intensity with an inverse peak pattern shape is formed at a part where the light intensity is small corresponding to the first local area 34. That is, it can be recognized that a light intensity distribution with a concave pattern suitable for crystallization and an inverse peak pattern that the light intensity is smaller than a threshold value α is actually obtained by irradiating the processed substrate with the laser beams by using the phase modulation element having the phase value pattern shown in FIG. 16A.

Figure 18A:
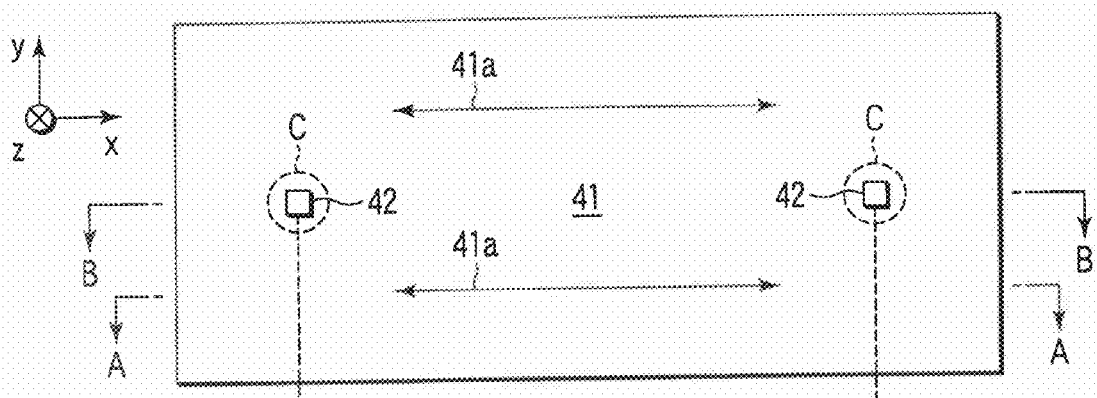
FIG. 18A is a schematic view illustrating yet another embodiment of the phase modulation element according to the present invention.

FIG. 18A is a view schematically showing yet another structure of the phase modulation element according to the present invention. Referring to FIG. 18A, to the phase modulation element 1 are provided a stripe-like area 41 which has a predetermined phase distribution and extends along a direction indicated by an arrow x which is a direction along which the phase varies and isolated areas 42 each of which has a phase value substantially different from that of the periphery in accordance with a part where the light intensity is small in a light intensity distribution formed by the effect of the stripe-like area 41. The isolated area 42 is an area which has an optically smaller size than a radius of a unit range C optically corresponding to the point spread distribution range R of the image formation optical system 3 and has a large phase difference.

Figure 18B:
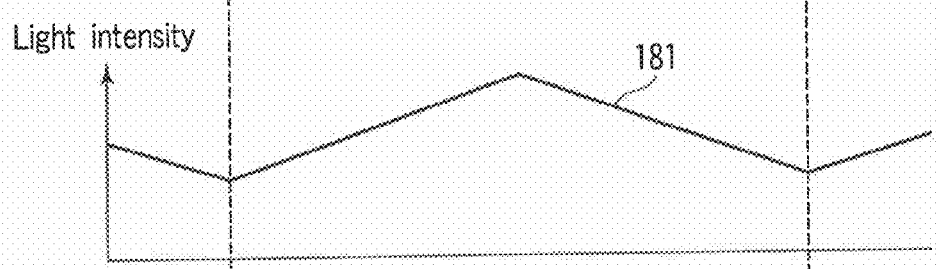
FIG. 18B is a schematic view showing a light intensity distribution along the line A-A in FIG. 18A.

By using the phase modulation element shown in FIG. 18A, a light intensity of light beams which are transmitted through an area separated from the isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from the isolated areas 42 by a predetermined distance in the direction indicated by an arrow y) in a direction indicated by an arrow x, the light intensity having a minimum value at a position separated from the isolated areas 42 by a predetermined distance in the direction indicated by the arrow y and the light intensity having a maximum value in the vicinity of an intermediate position between the isolated areas 42 in a direction along which the phase varies, as shown in FIG. 18B. In other words, there is obtained a light intensity distribution with a concave pattern having the V-shaped (an alphabetical letter [V] and an inverted [V] are alternately arranged in zigzags) conformation.

Figure 18C:
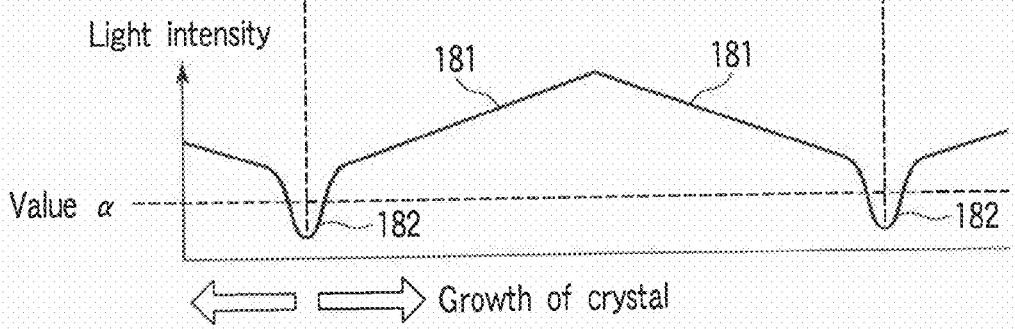
FIG. 18C is a schematic view showing a light intensity distribution along the border line B-B in FIG. 18A.

As to the light intensity of the light beams in the direction indicated by the arrow x transmitted through the isolated areas 42, a drop in light intensity with an inverse peak pattern shape including a part where the light intensity is locally small is formed at the part where the light intensity is small corresponding to each isolated area 42 by the effect of the isolated area 40 (since a phase value of each isolated area 42 is substantially different from a phase value of the periphery thereof) as shown in FIG. 18C when the phase modulation element depicted in FIG. 18A is used.

In regard to the phase distribution of the phase modulation element 1 to obtain a V-shaped light distribution pattern shown in FIG. 18B, using, e.g., the pattern shown in FIG. 11A can suffice. The light beams entering the phase modulation element 1 are transmitted from a front surface (front side) of a paper sheet in a direction of a rear surface (inner side) of the same as indicated by an arrow z in FIG. 18A. This phase modulation element 1 can be manufactured by selecting a thickness of, e.g., a quartz glass so as to form a desired phase value distribution. A change in thickness of the quartz glass can be formed by selective etching or an FIB.

As described above, by using the phase modulation element shown in FIG. 18A, there is obtained a combined light intensity distribution resulting from the light intensity distribution 181 with a concave pattern having, e.g., the V-shaped (an alphabetical letter [V] and an inverted [V] are alternately arranged in zigzags) and the light intensity distribution 182 with an inverse peak pattern including a part where the light intensity is locally small in the part where the light intensity is small in this light intensity distribution 181 with the concave pattern, i.e., a combined light intensity distribution with the concave pattern and the inverse peak pattern including the part where the light intensity is locally small shown in FIG. 18C.

As a result, a start point of the crystal growth can be caused to approximate the center of the light intensity distribution having the part where the light intensity is locally small as much as possible, thereby generating crystal grains with a large particle size. Moreover, a crystal generation position can be controlled to an arbitrary two-dimensional position. Additionally, it is possible to effect crystallization that the lateral growth with a large particle size is achieved by positioning the inverse peak pattern 182 including the part where the light intensity is locally small to, e.g., a seed crystal position in order to carry out crystallization. The isolated area 42 is not restricted to a square shape, and any shape such as a circular shape or a triangular shape can be used.

Figure 19A:
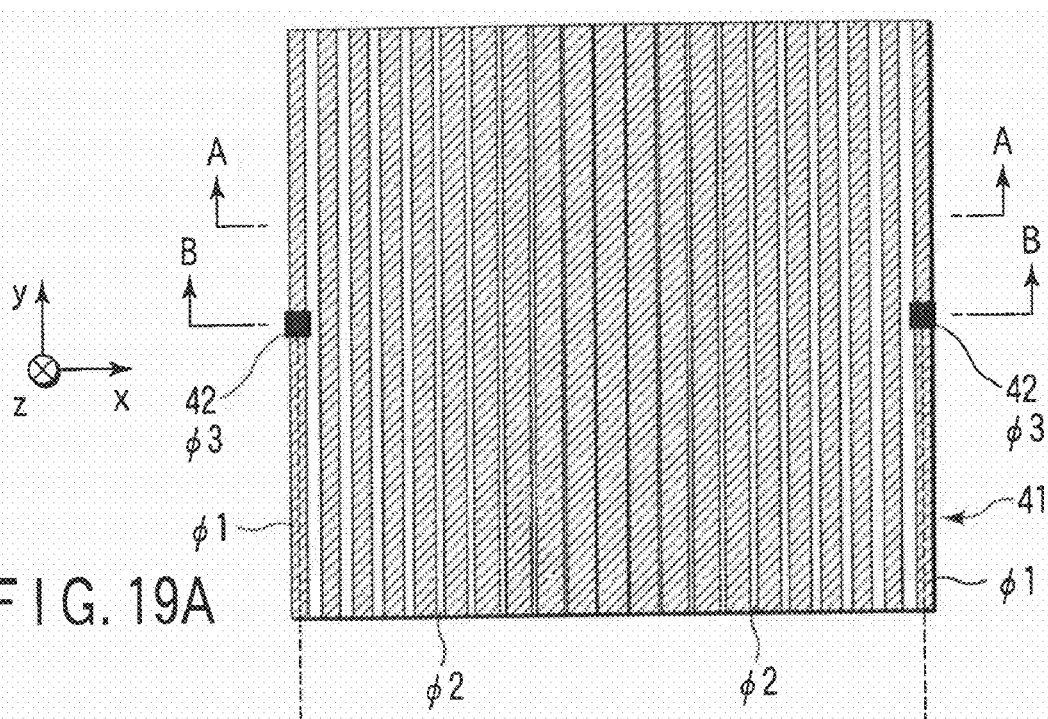
FIG. 19A is a schematic view illustrating a further embodiment of the phase modulation element according to the present invention.

FIG. 19A is a view schematically showing a further structure of the phase modulation element according to the present invention. Referring to FIG. 19A, in a line-and-space pattern constituting a stripe-like area 41 of the phase modulation element 1, a duty ratio (width of a line portion/pitch) is 100% at the center thereof, the duty ratio is linearly decreased 5% at a time toward the periphery, and the duty ratio is 50% on each of the both sides.

In the phase modulation element shown in FIG. 19A, each shaded line portion has a first phase value $\phi 1$ (e.g., 90 degrees), each non-shaded space portion shown as a space has a second phase value $\phi 2$ (e.g., zero degree), and each isolated area 42 has a third phase value $\phi 3$ (e.g., 225 degrees). As apparent from FIG. 19A, each isolated area 42 is arranged in accordance with a part where the light intensity is small in a light intensity distribution formed by the effect of the stripe-like area 41, and has a phase value substantially different from that of the periphery. The light beams entering the phase modulation element 1 are transmitted from a front surface (front side) of a paper sheet in a direction of a rear surface (inner side) of the same as indicated by an arrow z in FIG. 19A. This phase modulation element 1 can be readily manufactured by selecting a thickness of, e.g., a quartz glass so as to form a desired phase value distribution. A change in thickness of the quartz glass can be formed by selective etching or an FIB.

Figure 19B:
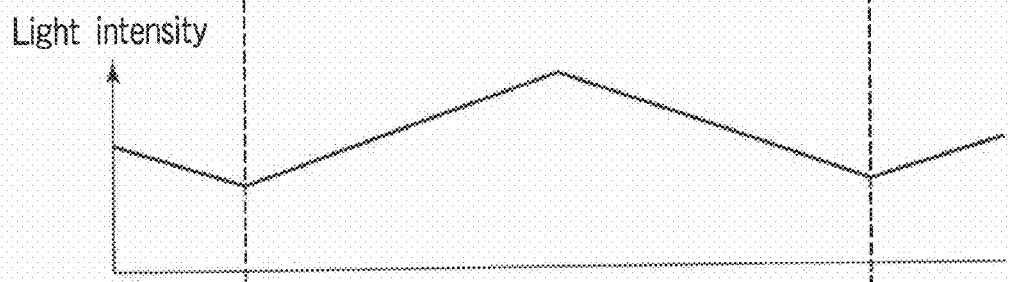
FIG. 19B is a schematic view showing a light intensity distribution along the line A-A in FIG. 19A.
Figure 19C:
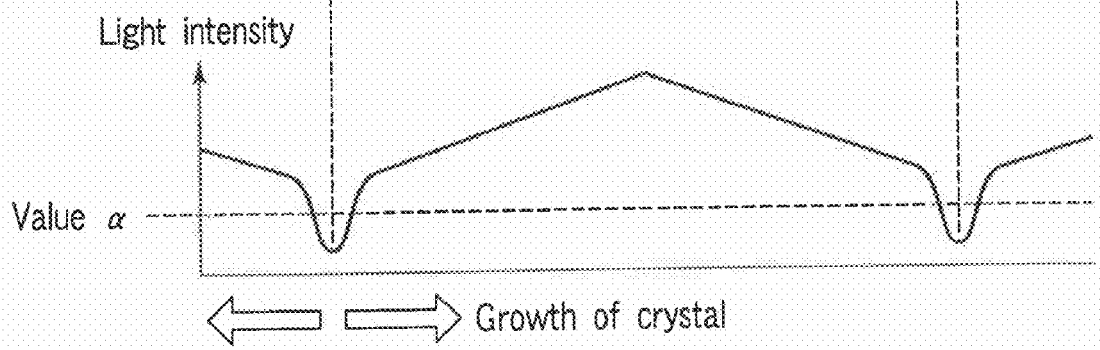
FIG. 19C is a schematic view showing a light intensity distribution along the border line B-B in FIG. 19A.

By using the phase modulation element shown in FIG. 19A, the light intensity of the light beams transmitted through an area separated from each isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from the isolated areas 42 by a predetermined distance in the direction indicated by the arrow y) in a direction indicated by an arrow x, the light intensity having a minimum value at a position separated from the isolated areas 42 by a predetermined distance in the direction indicated by the arrow y and the light intensity having a maximum value in the vicinity of an intermediate position between the isolated areas 42 in parallel with a direction along which the phase values as shown in FIG. 19B. That is, there is obtained a light intensity distribution with a concave pattern having a V-shaped (an alphabetical letter [V] and an inverted [V] are alternately arranged in zigzags) conformation. Additionally, a drop in light intensity having an inverse peak pattern shape including a part where the light intensity is locally small is formed at the part where the light intensity is small corresponding to each isolated area along a cross section including the isolated areas 42 as shown in FIG. 19C. As a result, it is possible to obtain a light intensity distribution with a concave pattern suitable for crystallization and an inverse peak pattern including a part where the light intensity is locally small.

Figure 20A:
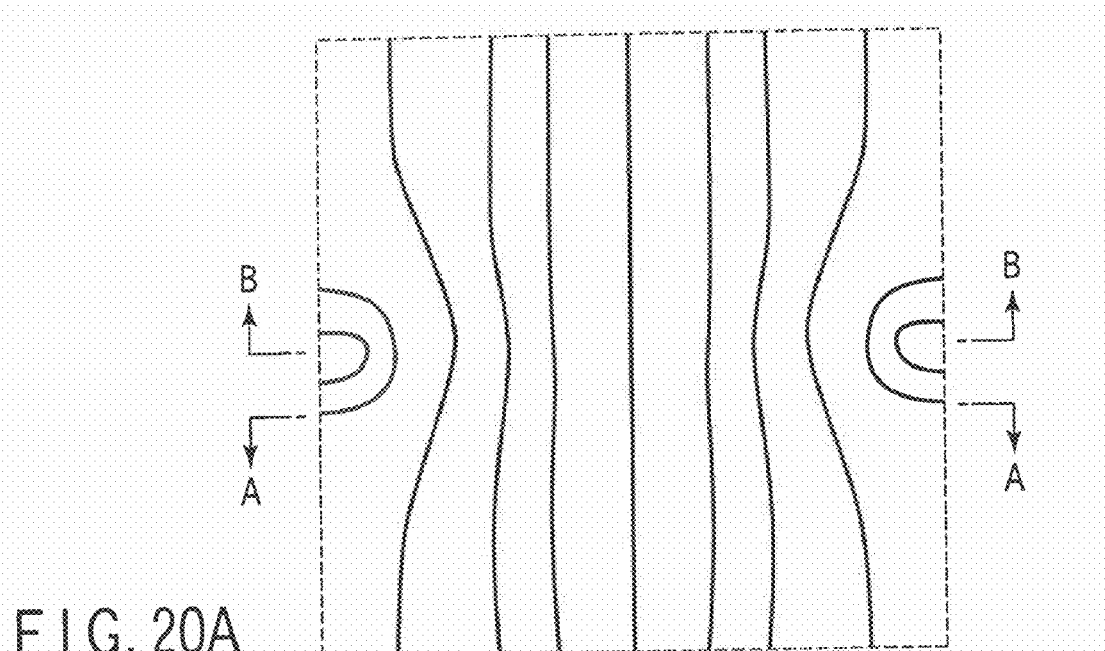
FIG. 20A is a schematic view showing in a contour map a light intensity distribution obtained in the phase modulation element depicted in FIG. 19A.
Figure 20B:
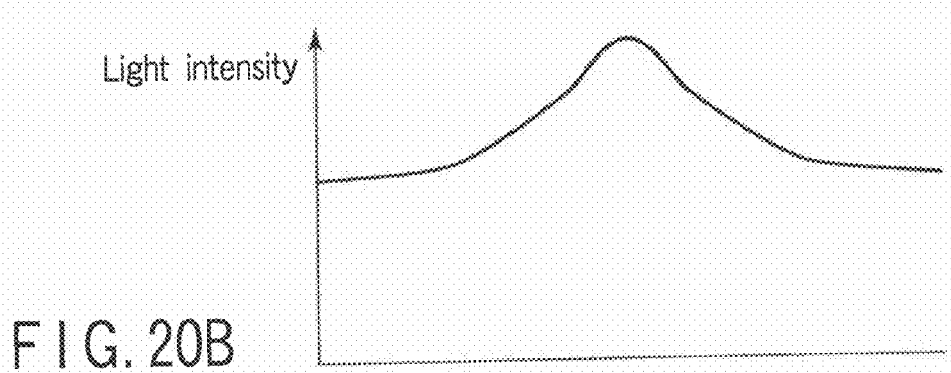
FIG. 20B is a schematic view showing a light intensity distribution along the line A-A in FIG. 20A.
Figure 20C:
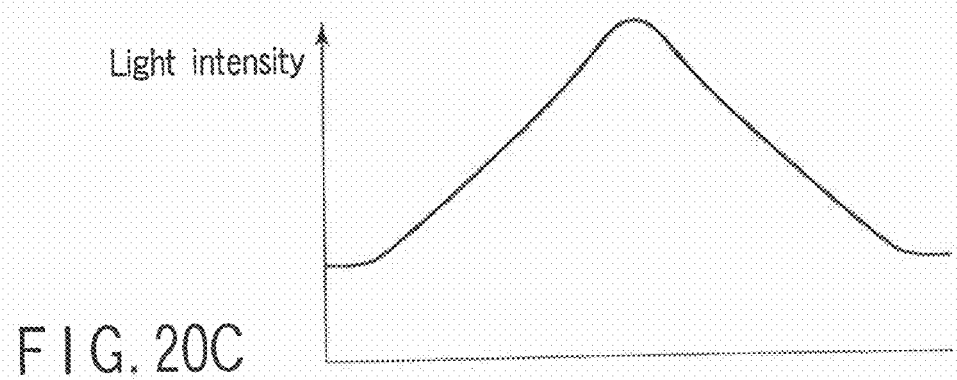
FIG. 20C is a schematic view showing a light intensity distribution along the border line B-B in FIG. 20A.

FIG. 20A shows a contour map of a light intensity distribution obtained in the phase modulation element depicted in FIG. 19A, FIG. 20B shows a light intensity distribution along the line A-A in FIG. 20A, and FIG. 20C shows a light intensity along the line B-B in FIG. 20A, respectively. It is to be noted that an image side numerical aperture NA of the image formation optical system 3 is set to 0.13 and an illumination sigma value is set to 0.43.

Comparing the FIG. 20B light intensity distribution along the line A-A in FIG. 20A with the FIG. 20C light intensity distribution along the line B-B in FIG. 20A parallel with the cross section including the isolated areas 42, it can be understood that a drop in light intensity having an inverse peak pattern shape which includes a part where the light intensity is locally small is formed at the part where the light intensity is small corresponding to each isolated area 42. That is, it can be recognized that a light intensity distribution with a concave pattern suitable for crystallization and an inverse peak pattern that the light intensity is smaller than a threshold value α is actually obtained by irradiating the processed substrate with laser beams by using the phase modulation element having the phase value pattern shown in FIG. 20A.

Figure 21A:
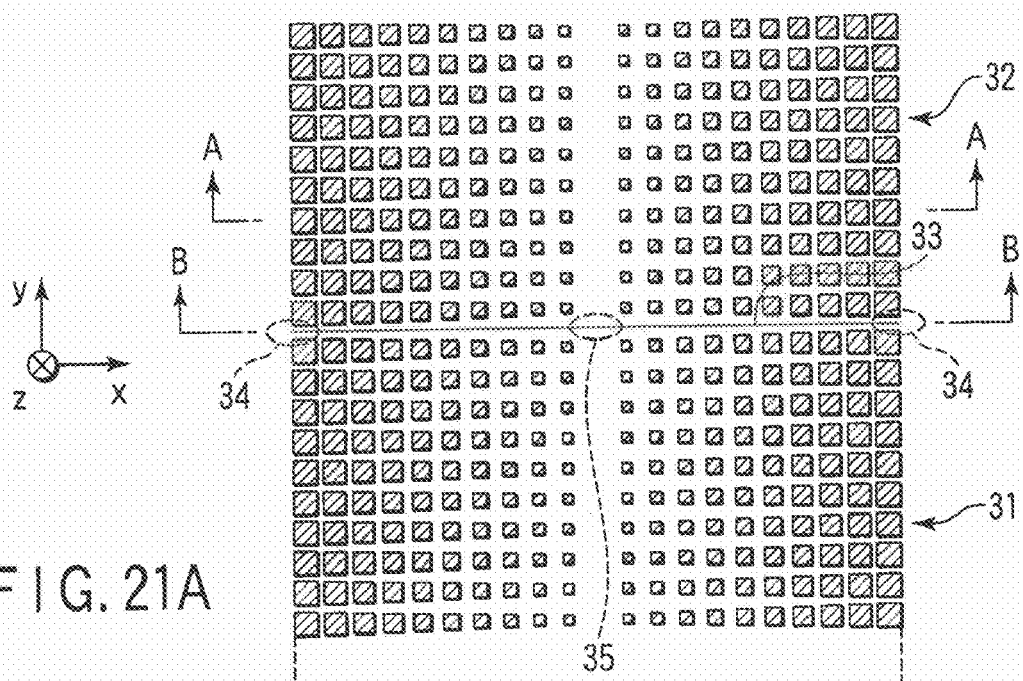
FIG. 21A is a schematic view illustrating a still further embodiment of the phase modulation element according to the present invention.

FIG. 21A is a view schematically showing a still further structure of the phase modulation element according to the present invention. Referring to FIG. 21A, in a pattern constituting a first stripe-like area 31 of the phase modulation element 1, each shaded rectangular area has a phase value of, e.g., 90 degrees, and a non-shaded area shown as a space has a phase value of, e.g., zero degree. On the other hand, in a pattern constituting a second stripe-like area 32, each shaded rectangular area has a phase value of, e.g., −90 degrees, and a non-shaded area shown as a space has a phase value of, e.g., zero degree.

The first stripe-like area 31 and the second stripe-like area 32 are configured to have substantially the same light intensity distributions which are formed in accordance therewith.

The light beams entering the phase modulation element 1 are transmitted from a front surface (front side) of a paper sheet in a direction of a rear surface (inner side) of the same as indicated by an arrow z in FIG. 21A. This phase modulation element 1 can be readily manufactured by selecting a thickness of, e.g., a quartz glass so as to form first and second phase values φ1 and φ2. A change in thickness of the quartz glass can be formed by selective etching or an FIB.

In the phase modulation element shown in FIG. 21A, an average phase value (e.g., approximately 45 degrees) on the first stripe-like area 31 side is substantially different from an average value (e.g., approximately −45 degrees) on the second stripe-like area 32 side in a first local area 34 defined on a border line 33 corresponding to a part where the light intensity in the light intensity distribution is small. On the other hand, in a second local area 35 defined on the border line 33 corresponding to a part where the light intensity in the light intensity distribution is large, an average phase value (e.g., approximately zero degree) on the first stripe-like area 31 side is substantially equal to an average phase value (e.g., approximately zero degree) on the second stripe-like area 32 side.

Figure 21B:
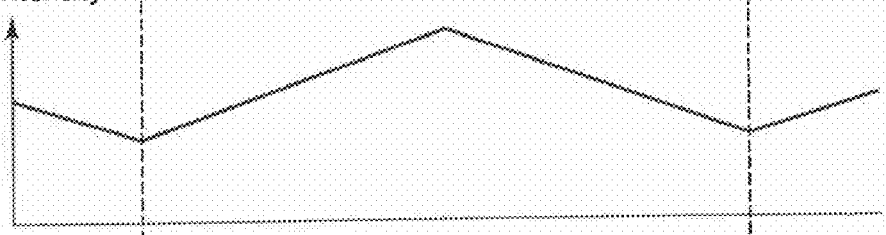
FIG. 21B is a schematic view showing a light intensity distribution along the line A-A in FIG. 21A.
Figure 21C:
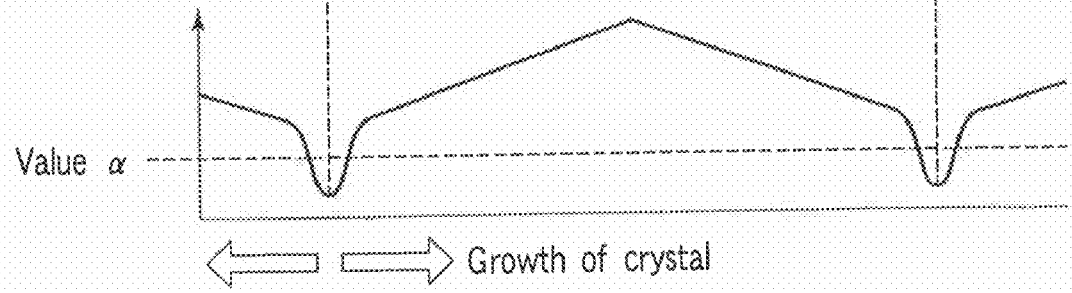
FIG. 21C is a schematic view showing a light intensity distribution along the border line B-B in FIG. 21A.

By using the phase modulation element shown in FIG. 21A, the light intensity of the light beams passing through an area (cross section along the line A-A) separated from the border line 33 by a predetermined distance in a direction indicated by an arrow y varies with a linearly falling gradient (characteristics that the light intensity becomes maximum at a position separated from the second local area 35 by a predetermined distance in the direction indicated by the arrow y and the light intensity is gradually decreased toward a position separated from the first local area 34 by a predetermined distance in the direction indicated by the arrow y) in a direction indicated by an arrow x, the light intensity having a maximum value at a position separated from the second local area 35 by a predetermined distance in the direction indicated by the arrow y and the light intensity having a minimum value at a position separated from the first local area 34 by a predetermined distance in the direction indicated by the arrow y, as shown in FIG. 21B. That is, there is obtained a light intensity distribution with a concave pattern having a V-shaped (an alphabetical letter [V] and an inverted [V] are alternately arranged in zigzags) conformation. Further, the light intensity of the light beams passing along the border line 33, i.e., the cross section including the first local area 34 and the second local area 35 takes a maximum value in an area corresponding to the second local area 35, and takes a minimum value in an area corresponding to the first local area 34. It is to be noted that a drop in light intensity having an inverse peak pattern shape which includes a part where the light intensity is locally small is formed in the area corresponding to the first local area 34. That is, there can be obtained a light intensity distribution with a concave pattern suitable for crystallization and an inverse peak pattern including a part where the light intensity is locally small.

FIG. 22A is a view schematically showing a yet further structure of the phase modulation element according to the present invention. Referring to FIG. 22A, in a pattern constituting a stripe-like area 41 of the phase modulation element 1, each shaded rectangular area has a phase value of, e.g., 90 degrees, and a non-shaded area shown as a space has a phase value of, e.g., zero degree. Furthermore, each isolated area 42 having a phase value (e.g., 225 degrees) substantially different from that of the periphery is provided in accordance with a part where a light intensity is small in a light intensity distribution formed by the effect of the stripe-like area 41. As apparent from FIG. 22A, each isolated area 42 is arranged in accordance with the part where the light intensity is small in the light intensity distribution formed by the effect of the stripe-like area 41, and has a phase value substantially different from that of the periphery. The light beams entering the phase modulation element 1 are transmitted from a front surface (front side) of a paper sheet in a direction of a rear surface (inner side) of the same as indicated by an arrow z in FIG. 22A. This phase modulation element 1 can be readily manufactured by selecting a thickness of, e.g., a quartz glass so as to form a desired phase value distribution. A change in thickness of the quartz glass can be formed by selective etching or an FIB.

By using the phase modulation element shown in FIG. 22A, the light intensity of the light beams which pass through an area separated from each isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from each isolated area 42 by a predetermined distance in the direction indicated by the arrow y) in a direction indicated by an arrow x with the light intensity having a minimum value at a position separated from each isolated area 42 by a predetermined distance in the direction indicated by the arrow y and the light intensity having a maximum value in the vicinity of the intermediate position between the isolated areas 42 in parallel with a direction along which the phase varies, as shown in FIG. 22B. That is, there is obtained a light intensity distribution with a concave pattern having a V-shaped (an alphabetical letter [V] and an inverted [V] are alternately arranged in zigzags) conformation. Furthermore, a drop in light intensity with an inverse peak pattern shape including a part where the light intensity is locally small is formed at the part where the light intensity is small corresponding to each isolated area 42, as shown in FIG. 22C. As a result, it is possible to obtain a light intensity distribution with a concave pattern suitable for crystallization and an inverse peak pattern including the part where the light intensity is locally small.

Figure 23A:
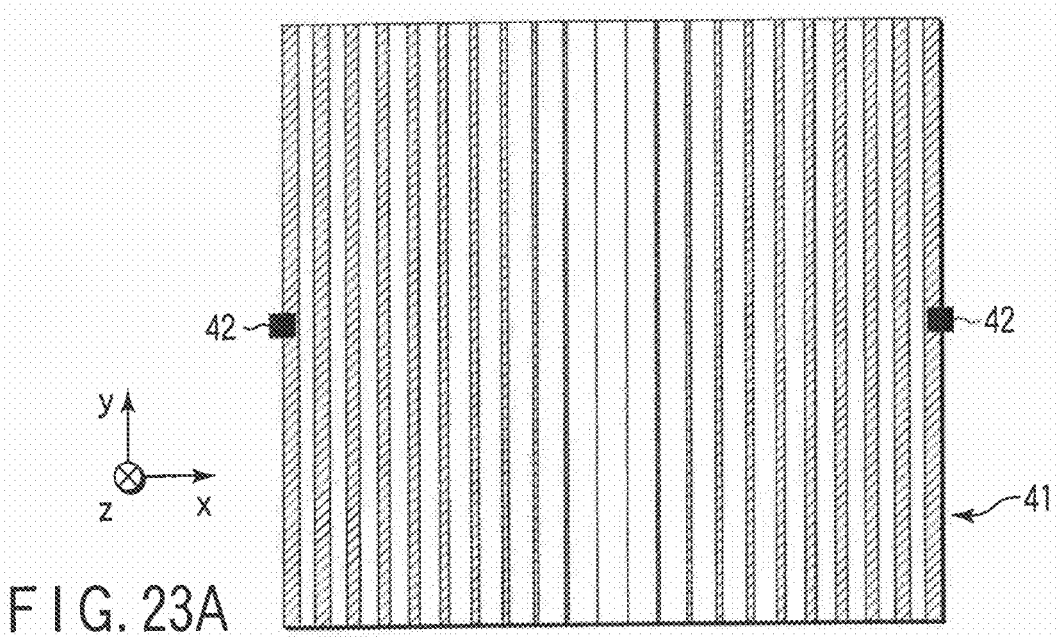
FIG. 23A is a schematic view illustrating another embodiment of the phase modulation element according to the present invention.

FIG. 23A is a view schematically showing another structure of the phase modulation element according to the present invention. Referring to FIG. 23A, in a pattern constituting a stripe-like area 41 of the phase modulation element 1, each shaded line portion has a phase value of, e.g., 90 degrees, and each non-shaded space portion shown as a space has a phase value of, e.g., zero degree, and isolated areas 42 each having a phase value (e.g., 225 degrees) substantially different from that of the periphery are provided in accordance with parts having the small light intensity in a light intensity distribution formed by the effect of the stripe-like area 41. The light beams entering the phase modulation element 1 are transmitted from a front surface (front side) of a paper sheet in a direction of a rear surface (inner side) of the same as indicated by an arrow z in FIG. 23A. This phase modulation element 1 can be readily manufactured by selecting a thickness of, e.g., a quartz glass so as to form a desired phase value distribution. A change in thickness of the quartz glass can be formed by selective etching or an FIB.

Figure 23B:
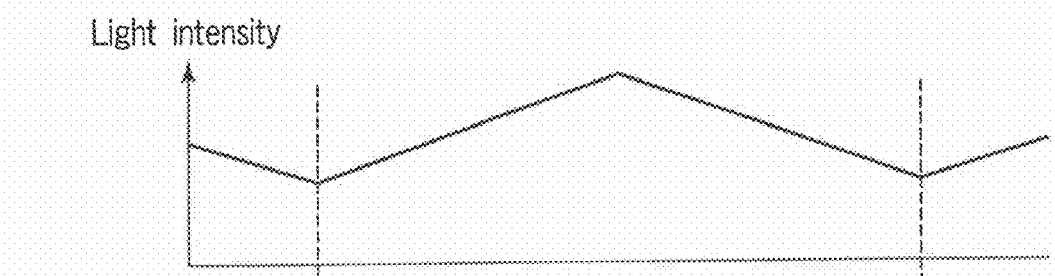
FIG. 23B is a schematic view showing a light intensity distribution along the line A-A in FIG. 23A.
Figure 23C:
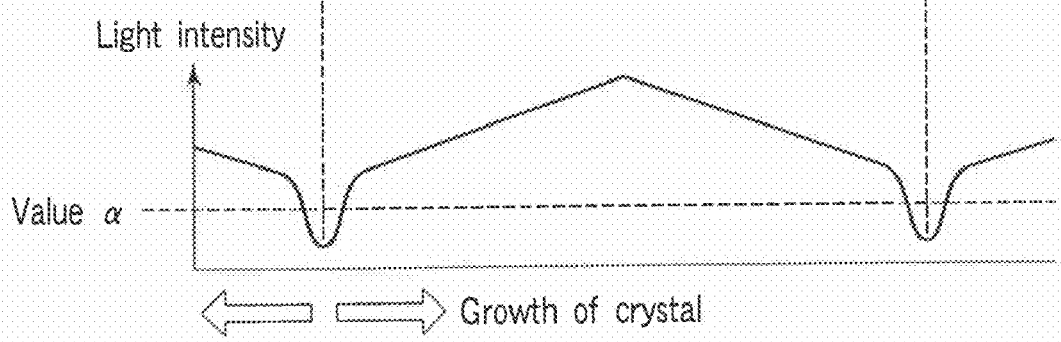
FIG. 23C is a schematic view showing a light intensity distribution along the border line B-B in FIG. 23A.

By using the phase modulation element shown in FIG. 23A, a light intensity of the light beams passing through an area separated from each isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from each isolated area 42 by a predetermined distance in the direction indicated by an arrow y) in a direction indicated by an arrow x, the light intensity having a minimum value at a position separated from each isolated area 42 by a predetermined position in the direction indicated by the arrow y and the light intensity having a maximum value in the vicinity of the intermediate position between the isolated areas 42 in parallel with a direction along which the phase varies, as shown in FIG. 23B. That is, there is obtained a light intensity distribution with a concave pattern having a V-shaped (an alphabetical letter [V] and an inverted [V] are alternately arranged in zigzags) conformation. Moreover, a drop in light intensity with an inverse peak pattern shape including a part where the light intensity is locally small is formed at the part where the light intensity is small corresponding to each isolated area 42 along a cross section including each isolated area 42. As a result, there can be obtained a light intensity distribution with a concave pattern suitable for crystallization and an inverse peak pattern including the part where the light intensity is locally small.

FIG. 24A is a view schematically showing still another structure of the phase modulation element according to the present invention. Referring to FIG. 24A, in a pattern constituting a stripe-like area 41 of the phase modulation element 1, a phase value of each shaded line portion varies in a range between, e.g., zero degree and 90 degrees in accordance with each line portion, and each non-shaded space portion shown as a space has a phase value of, e.g., zero degree. It is to be noted that each isolated area 42 having a phase value (e.g., 225 degrees) substantially different from that of the periphery is provided in accordance with a part having a small light intensity in a light intensity distribution formed by the effect of the stripe-like area 41. The light beams entering the phase modulation element 1 are transmitted from a front surface (front side) of a paper sheet in a direction of a rear surface (inner side) of the same as indicated by an arrow z in FIG. 24A. This phase modulation element 1 can be readily manufactured by selecting a thickness of, e.g., a quartz glass so as to form a desired phase value distribution. A change in thickness of the quartz glass can be formed by selective etching or an FIB.

By using the phase modulation element shown in FIG. 24A, a light intensity of the light beams passing through an area separated from each isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from each isolated area 42 by a predetermined distance in the direction indicated by the arrow y) in a direction indicated by an arrow x, the light intensity having a minimum value at a position separated from each isolated area 42 by a predetermined distance in the direction indicated by the arrow y and the light intensity having a maximum value in the vicinity of the intermediate position between the isolated areas 42 in parallel with a direction along which the phase varies, as shown in FIG. 24B. That is, there is obtained a light intensity distribution with a concave pattern having a V-shaped (an alphabetical character [V] and an inverted [V] are alternately arranged in zigzags) conformation. Furthermore, a drop in light intensity with an inverse peak pattern shape including a part where the light intensity is locally small is formed at the part where the light intensity is small corresponding to each isolated area 42 as shown in FIG. 24C. As a result, there can be obtained a light intensity distribution with a concave pattern suitable for crystallization and an inverse peak pattern including the part where the light intensity is locally small.

Figure 25A:
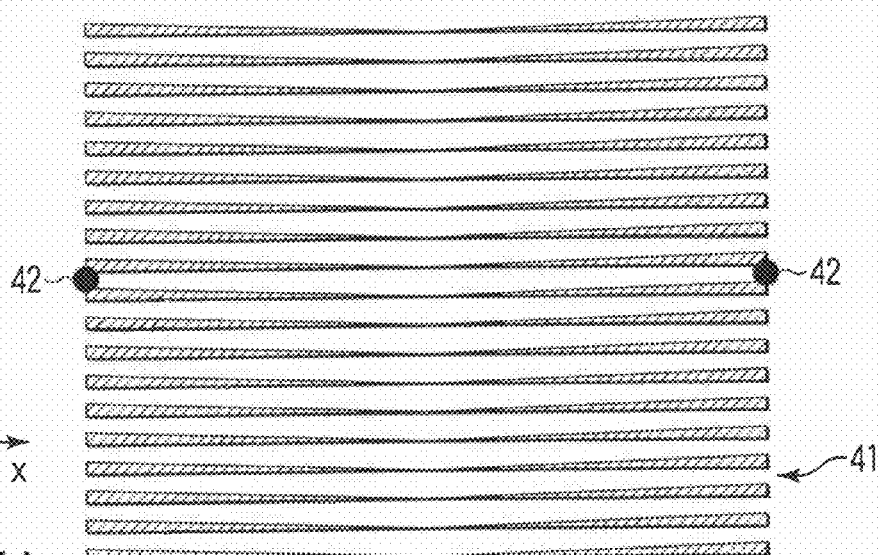
FIG. 25A is a schematic view illustrating yet another embodiment of the phase modulation element according to the present invention.

FIG. 25A is a view schematically showing yet another structure of the phase modulation element according to the present invention. Referring to FIG. 25A, in a pattern constituting a stripe-like area 41 of the phase modulation element 1, each shaded stripe-like area has a phase value of, e.g., 90 degrees, each non-shaded area shown as a space has a phase value of, e.g., zero degree, and isolated areas 42 each having a phase value (e.g., 225 degrees) substantially different from that of the periphery are provided in accordance with parts each having a small light intensity in a light intensity distribution formed by the effect of the stripe-like area 41. The light beams entering the phase modulation element 1 are transmitted from a front surface (front side) of a paper sheet in a direction of a rear surface (inner side) of the same as indicated by an arrow z in FIG. 25A. This phase modulation element 1 can be readily manufactured by selecting a thickness of, e.g., a quartz glass so as to form first and second phase values $\phi 1$ and $\phi 2$. A change in thickness of the quartz glass can be formed by selective etching or an FIB.

Figure 25B:
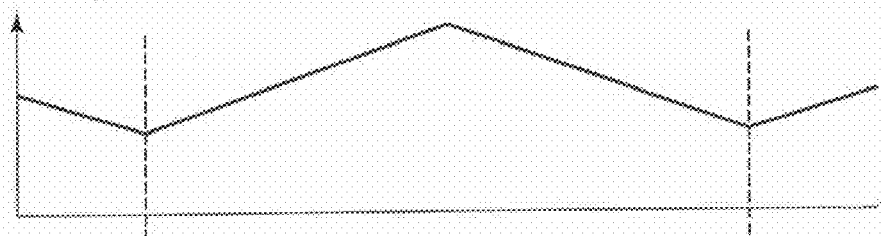
FIG. 25B is a schematic view showing a light intensity distribution along the lien A-A in FIG. 25A.
Figure 25C:
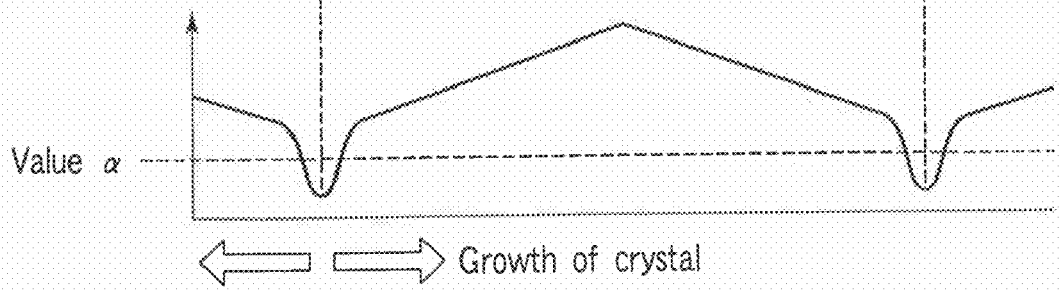
FIG. 25C is a schematic view showing a light intensity distribution along the line the border line B-B in FIG. 25A.

By using the phase modulation element shown in FIG. 25A, a light intensity of the light beams passing through an area separated from each isolated area 42 by a predetermined distance in a direction indicated by an arrow y varies with a linearly falling gradient (characteristics that the light intensity becomes maximum at an intermediate position of the isolated areas 42 and the light intensity is gradually decreased toward a position separated from each isolated area 42 by a predetermined distance in the direction indicated by the arrow y) in a direction indicated by an arrow x, the light intensity having a minimum value at the position separated from each isolated area 42 by a predetermined distance in the direction indicated by the arrow y and the light intensity having a maximum value in the vicinity of the intermediate position between the isolated areas 42 in parallel with a direction along which the phase varies, as shown in FIG. 25B. That is, there is obtained a light intensity distribution with a concave pattern having a V-shaped (an alphabetical letter [V] and an inverted [V] are alternately arranged in zigzags) conformation. Moreover, as shown in FIG. 25C, a drop in light intensity with an inverse peak pattern shape including a part where the light intensity is locally small is formed at the part where the light intensity is small corresponding to each isolated area 42 along a cross section including each isolated area 42. As a result, there can be obtained a light intensity distribution with a concave pattern suitable for crystallization and an inverse peak pattern including the parts where the light intensity is locally small.

It is to be noted that the example that the phase modulation element 1 takes the finite number of phase values are described in the above various embodiments but the phase value may continuously vary. For example, when interpolation processing is carried out by using an arbitrary method in order to substitute the stepped distribution of the phase modulation element 1 in the foregoing embodiments for a smooth curved surface, the equivalent advantages can be obtained.

Additionally, the phase modulation element 1 can be realized by an irregular shape corresponding to a phase value by using a technique to manufacture a regular phase shift mask.

Further, the phase modulation element 1 can be also realized by using a distribution of refractive indices of a material as well as the irregular shape.

Furthermore, the phase modulation element 1 such as a liquid crystal element or a micro mirror device which can vary a phase modulation quantity may be realized.

Moreover, in the foregoing embodiments, the light intensity distribution can be calculated on a design stage, but it is desirable to observe and confirm the light intensity distribution on an actual processed surface. In order to realize this, it is good enough to magnify the processed surface of the processed substrate 4 by using the optical system and input a result by utilizing an imaging element such as a CCD. Incidentally, if the light beams to be used are ultraviolet rays, the optical system including a CCD element and others may be possibly restricted in sensitivity or photoelectric conversion efficiency. Therefore, a fluorescent screen may be provided on the processed surface only during observation in order to convert the light beams into visible light beams. Additionally, although the concrete structural examples of the phase modulation element 1 have been described in connection with the foregoing embodiments, various kinds of modifications of the structure of the phase modulation element 1 can be carried out within the scope of the present invention.

FIGS. 26A to 26E are process cross-sectional views showing steps to manufacture an electronic device in an area (processed surface) crystallized by using the crystallization apparatus according to this embodiment.

Figure 26A:
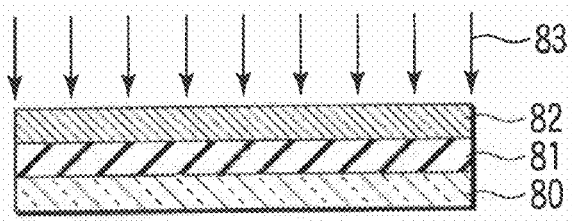
FIGS. 26A to 26E are schematic view illustrating an example of a process to manufacture an electronic device on a transparent substrate obtained by a crystallization apparatus according to the present invention.

As shown in FIG. 26A, there is prepared a processed substrate 4 having an underlying film 81 (e.g., SiN having a film thickness of 50 nm and an $SiO_2$ laminated film having a film thickness of 100 nm) and an amorphous semiconductor film 82 (e.g., Si, Ge, SiGe and others each having a film thickness of approximately 50 nm to 200 nm) formed on an insulated substrate 80 (e.g., alkali glass, quartz glass, plastic or polyimide) by using chemical vapor deposition or a sputtering method.

Subsequently, all or a part of a surface of the amorphous semiconductor film 82, e.g., a predetermined area is irradiated with laser beams 83 (e.g., KrF excimer laser beams or an XeCl excimer laser beams) by using the crystallization apparatus shown in FIG. 1 through the phase modulation element 1 according to the above-described various kinds of conformations, e.g., the phase modulation element 1 shown in FIG. 9C.

Figure 26B:

Therefore, a polycrystal semiconductor film or a single-crystallized semiconductor film 84 having a crystal with a large particle size is generated as shown in FIG. 26B.

Figure 26C:
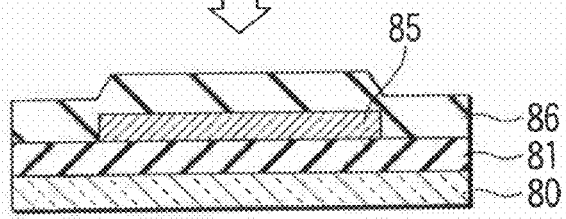

Then, as shown in FIG. 26C, the polycrystal semiconductor film or the single-crystallized semiconductor film 84 is processed into an island-shaped semiconductor film 85 which becomes an area used to form, e.g., a thin film transistor by using a photolithography technique, and an $SiO_2$ film having a film thickness of 20 nm to 100 nm as a gate insulating film 86 is formed on a surface of the semiconductor film 85 by using, e.g., chemical vapor deposition or a sputtering method.

Figure 26D:
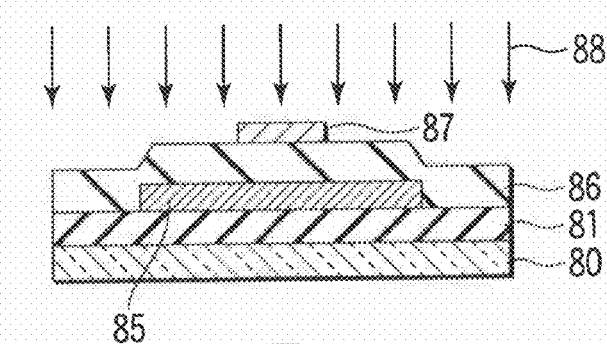

Further, as shown in FIG. 26D, a gate electrode 87 (e.g., silicide or MoW) is formed on the gate insulating film, impurity ions 88 (phosphorous in case of an N channel transistor, and boron in case of a P channel transistor) are implanted with the gate electrode 87 being used as a mask. Thereafter, although not shown, annealing processing is carried out in a nitrogen atmosphere (e.g., one hour at 450° C.), and the impurities are activated, thereby forming a source area 91 and a drain area 92 in the island-shaped semiconductor film 85.

Figure 26E:
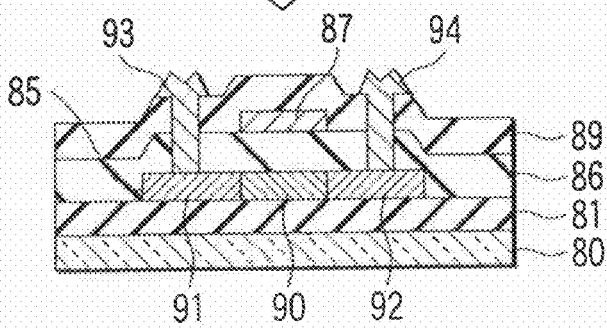
Figure 27:
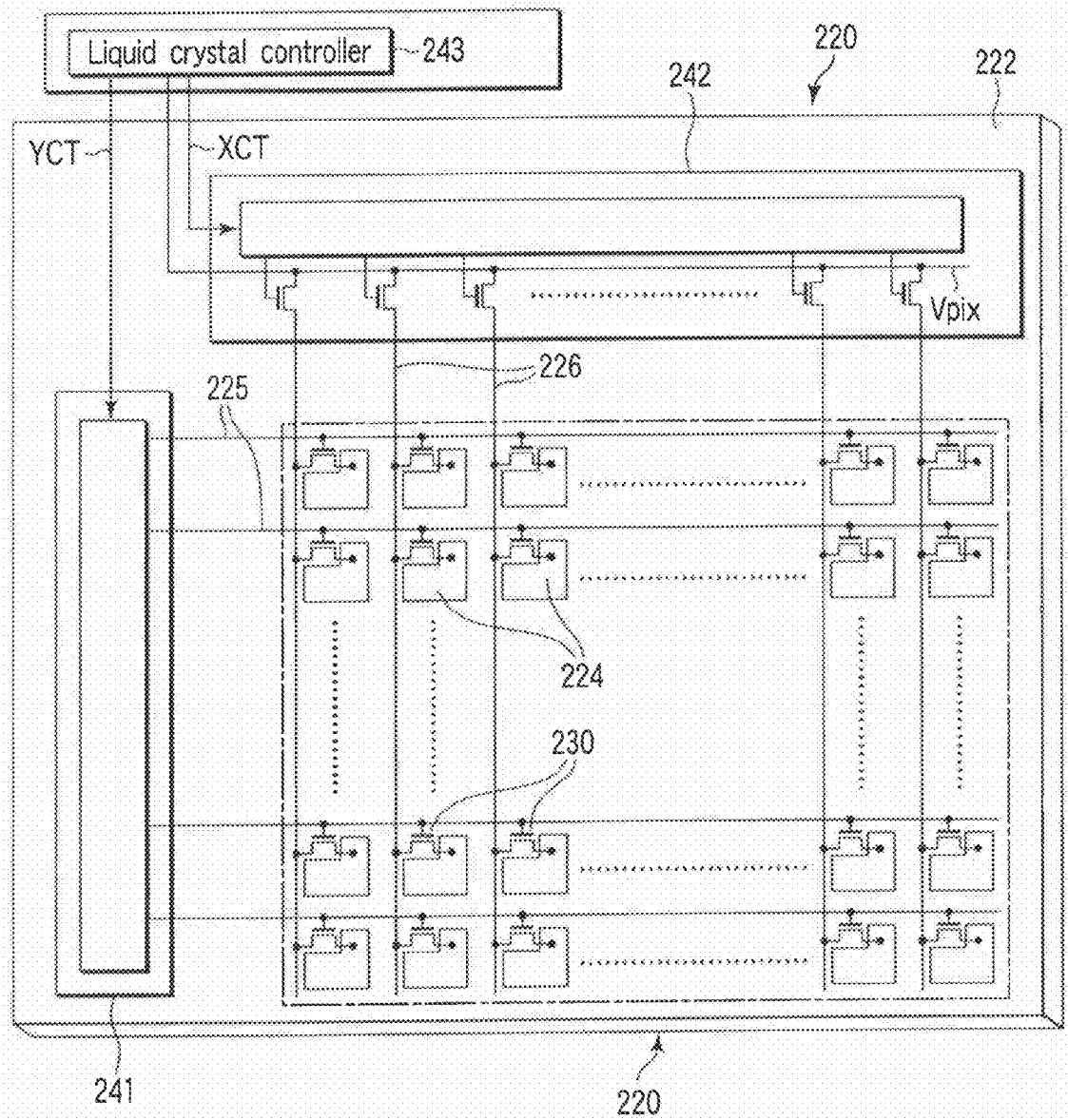
FIG. 27 is a schematic view illustrating an example to apply a transparent substrate obtained by the crystallization apparatus according to the present invention to a display apparatus, e.g., an active matrix type liquid crystal display.

Then, as shown in FIG. 26E, for example, an interlayer insulating film 89 is formed, contact holes are formed, and a source electrode 93 and a drain electrode 94 connected with a source 91 and a drain 92 which are connected through a channel 90 are formed.

In the above-described steps, a channel 90 is formed in accordance with a position of a crystal with a large particle size of the polycrystal semiconductor film or the single-crystallized semiconductor film 84 generated in the steps shown in FIGS. 26A and 26B.

Based on the above-described steps, a thin film transistor (TFT) can be formed to the polycrystal transistor or the single-crystallized semiconductor.

The polycrystal transistor or the single-crystallized transistor manufactured in the steps shown in FIGS. 26A to 26E can be applied to a drive circuit for, e.g., a liquid crystal display (display) or an EL (electroluminescence) display, or an integrated circuit for a memory (SPAM or DRAM) or a CPU.

A description will now be given as to an embodiment that a base material including an area crystallized by using the crystallization apparatus according to this embodiment is applied to a display apparatus, e.g., a liquid crystal display.

A method for forming a display apparatus including TFTs will now be described hereinafter.

Figure 28:
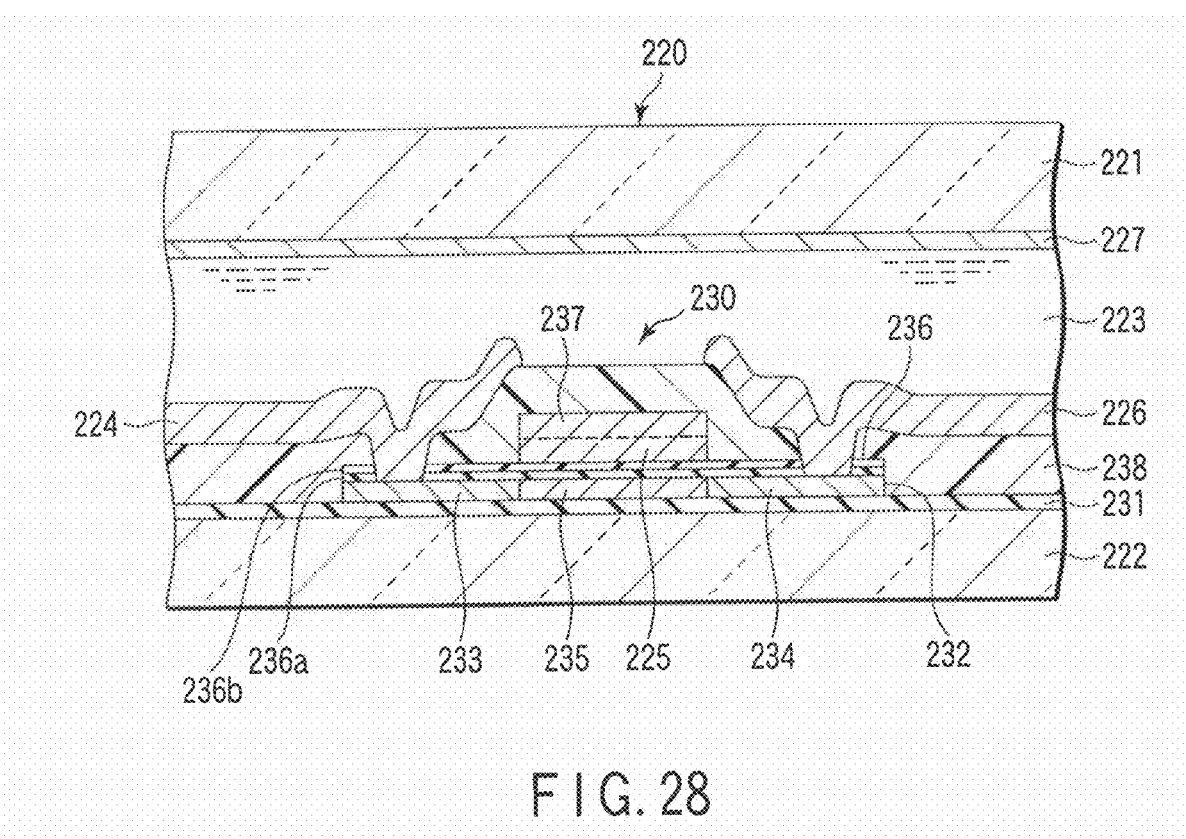
FIG. 28 is a schematic view illustrating an example to apply a transparent substrate obtained by the crystallization apparatus according to the present invention to a display apparatus, e.g., an active matrix type liquid crystal display.

FIGS. 26 and 28 show a display apparatus, e.g., an active matrix type liquid crystal display. The display apparatus 220 will be referred to as a liquid crystal display hereinafter.

First, the liquid crystal display 220 will be described. The liquid crystal display 220 comprises a pair of front and rear transparent base substances 221 and 222, a liquid crystal layer 223, pixel electrodes 224, scanning wirings 225, signal wirings 226, an opposed electrode 227, TFTs 230 and others.

As the pair of transparent base substances 221 and 222, a pair of glass sheets can be used, for example. These transparent base substances 221 and 222 are joined through a non-illustrated frame-shaped sealing material. The liquid crystal layer 223 is provided to an area surrounded by the sealing material between the pair of transparent base substances 221 and 222.

On the inner surface of one of the pair of transparent base substances 221 and 222, e.g., the transparent base substance 222 on the rear side are provided a plurality of pixel electrodes 224 provided in a matrix form in a row direction and a column direction, a plurality of TFTs 230 electrically connected with the plurality of pixel electrodes 224, and scanning wirings 225 and signal wirings 226 which are electrically connected with the plurality of TFTs 230.

The scanning wirings 225 are provided along the row direction of the pixel electrodes 224. One end of each of the scanning wirings 225 is connected with each of a plurality of scanning wiring terminals (not shown) provided at an edge portion of the rear transparent base substance 222 on one side. A plurality of scanning wiring terminals are respectively connected with a scanning line drive circuit 241.

On the other hand, the signal wirings 226 are provided along the column direction of the pixel electrodes 24. One end of each of these signal wirings 226 is connected with each of a plurality of signal wiring 226 terminals (not shown) provided at a one end edge portion of the rear transparent base substance 222. The plurality of signal wiring 226 terminals are respectively connected with a signal line drive circuit 242. The scanning line drive circuit 241 and the signal line drive circuit 242 are respectively connected with a liquid crystal controller 243. The liquid crystal controller 243 receives an image signal and a synchronization signal supplied from, e.g., the outside, and generates a pixel picture signal Vpix, a vertical scanning control signal YCT and a horizontal scanning control signal XCT.

One film-like transparent opposed electrode 227 which is opposed to the plurality of pixel electrodes 224 is provided on an inner surface of the transparent base substance 221 on a front side which is the other transparent base substance. Furthermore, on the inner surface of the transparent base substance 221 on the front side may be provided a color filter according to a plurality of pixel portions at which the plurality of pixel electrodes 224 are opposed to the opposed electrode 227, and a light shielding film in accordance with each area between the pixel portions.

A non-illustrated deflecting plate is provided on the outer side of the pair of transparent base substances 221 and 222. Moreover, in the transmission type liquid crystal display 220, a non-illustrated surface light source is provided on the rear side of the rear transparent base substance 222. It is to be noted that the liquid crystal display 220 may be of a reflection type or a semi-transmission reflection type.

As described above, in the crystallization apparatus and the crystallization method according to the present invention, the phase modulation element has a phase distribution based on a phase modulation unit which is optically smaller than a radius of a point spread distribution range R of the image formation optical system. Therefore, by appropriately changing a combination of a plurality of unit vectors in a unit range optically corresponding to the point spread distribution range R of the image formation optical system, a light intensity distribution to be formed can be analytically controlled in accordance with a simple calculation. As a result, in the present invention, based on a light intensity distribution with, e.g., a concave pattern that a light intensity is minimum at the center and the light intensity is increased toward the periphery, the sufficient lateral growth of a crystal from a crystal nucleus can be realized, and a crystallized semiconductor film with a large particle size can be generated.

For example, there is provided a crystallization apparatus comprising: a phase modulation element; an illumination system used to illuminate the phase modulation element; an image formation optical system arranged in a light path between the phase modulation element and a polycrystal semiconductor film or an amorphous semiconductor film, wherein the phase modulation element has a phase distribution based on a phase modulation unit which is optically smaller than a radius of a point spread distribution range of the image formation optical system, and a crystallized semiconductor film is generated by irradiating the polycrystal semiconductor film or the amorphous semiconductor film with light beams having a predetermined light intensity distribution. In this structure, the phase modulation element has the phase distribution based on the phase modulation unit which is optically smaller than the radius of the point spread distribution range of the image formation optical system. Therefore, by appropriately changing a combination of a plurality of unit vectors in a unit range optically corresponding to the point spread distribution range of the image formation optical system, a light intensity distribution to be formed can be analytically controlled in accordance a simple calculation. A crystallized semiconductor film with a large particle size can be generated by causing a lateral growth of a crystal from a crystal nucleus based on a light intensity distribution with, e.g., a concave pattern that a light intensity is minimum at the center and the light intensity is increased toward the periphery.

Moreover, according to the present invention, there is provided an apparatus comprising: a phase modulation element; an illumination system used to illuminate the phase modulation element; and an image formation optical system arranged in a light path between the phase modulation element and a predetermined surface, wherein the phase modulation element has a phase distribution based on a phase modulation unit which is optically smaller than a radius of a point spread distribution range of the image formation optical system, and a predetermined light intensity distribution is formed on the predetermined surface. In this case, the light intensity distribution formed on the predetermined surface can be likewise analytically controlled in accordance with a simple calculation in an appropriate apparatus other than the crystallization apparatus.

That is, the phase modulation element has a phase distribution that area shares of a first area having a first phase value and a second area having a second phase value vary depending on each position. In this case, it is preferable that the phase modulation element has a plurality of cells each of which is optically smaller than the radius of the point spread distribution range of the image formation optical system and area shares of the first area and the second area in each cell vary in accordance with each cell. Alternatively, it is preferable that the phase modulation element has a plurality of pixels each of which is optically smaller than the radius of the point spread distribution range of the image formation optical system, each pixel has a fixed value and the number of pixels having the same phase value per unit range optically corresponding to the point spread distribution range vary in accordance with each unit range. Alternatively, it is preferable that the phase modulation element has a plurality of stripe-like areas each having a width optically smaller than the radius of the point spread distribution range of the image formation optical system, each stripe-like area has a fixed phase value, and a width of each stripe-like area varies along a longitudinal direction. Alternatively, it is preferable that the phase modulation element has a line-and-space pattern having an optically smaller width than the radius of the point spread distribution range of the image formation optical system, each line portion has the first phase value, each space portion has the second phase value and a ratio of a width of the line portion and a width of the space portion which are adjacent to each other varies along a widthwise direction. Additionally, the phase modulation element has a cyclic divided area structure, each divided area has a fixed phase value, and the phase modulation element has a phase distribution that the phase value varies in accordance with each divided area. In this case, it is preferable that the phase modulation element has a plurality of pixels each of which is optically smaller than the radius of the point spread distribution range of the image formation optical system, each pixel has a fixed phase value, and the phase value varies in accordance with each pixel. Alternatively, it is preferable that the phase modulation element has a line-and-space pattern whose width is optically smaller than the radius of the point spread distribution range of the image formation optical system and the phase value varies in accordance with each line portion. Further, the phase modulation element has a first stripe-like area which has a first phase distribution and extends in a direction along which the phase varies and a second stripe-like area which has a second phase distribution and extends in a direction along which the phase varies, the first stripe-like area and the second stripe-like area are adjacent to each other with a border line in the direction along which the phase varies therebetween, and an average phase value on the first stripe-like area side is substantially different from an average phase value on the second stripe-like area side in a local area on the border line.

In this case, it is preferable that the first stripe-like area and the second stripe-like area are configured to have substantially the same light intensity distributions formed in accordance therewith, an average phase value on the first stripe-like area side is substantially different from an average phase value on the second stripe-like area side in a first local area on the border line corresponding to a part with a small intensity in the light intensity distribution, and the average phase value on the first stripe-like area side is substantially equal to the average phase value on the second stripe-like area side in a second local area on the border line corresponding to a part with a large intensity in the light intensity distribution. Furthermore, it is preferable that the first stripe-like area and the second stripe-like area has a line-and-space pattern whose width is optically smaller than the radius of the point spread distribution range of the image formation optical system, each line portion has the first phase value, each space portion has the second phase value, and a ratio in width of the line portion and the space portion which are adjacent to each other varies along a widthwise direction. Alternatively, it is preferable that the first stripe-like area and the second stripe-like area has a line-and-space pattern whose width is optically smaller than the radius of the point spread distribution range of the image formation optical system, and the phase value varies in accordance with each line portion. Moreover, the phase modulation element comprises isolated areas each of which is optically smaller than the radius of the point spread distribution range of the image formation optical system and has a phase value substantially different from that of the periphery in accordance with parts with a small light intensity in a light intensity distribution to be formed. Additionally, in the first or second embodiment, it is preferable that the predetermined light intensity distribution has a light intensity distribution with a concave pattern that the light intensity is increased from a central area having a first intensity toward the periphery. In this case, it is preferable that the light intensity distribution with the concave pattern has a distribution that the light intensity is one-dimensionally increased from the central area toward the periphery. Further, it is preferable that the predetermined light intensity distribution has a light intensity distribution with an inverse peak pattern that the light intensity is suddenly increased from a second central area having a second light intensity substantially smaller than the first light intensity toward the periphery in the vicinity of the central area of the light intensity distribution with the concave pattern.

Furthermore, according to the present invention, there is provided a crystallization method comprising: illuminating a phase modulation element having a phase distribution based on a phase modulation unit optically smaller than a radius of a point spread distribution range of an image formation optical system; and irradiating a polycrystal semiconductor film or an amorphous semiconductor film with light beams having a predetermined light intensity distribution through the image formation optical system arranged in a light path between the phase modulation element and the polycrystal semiconductor film or the amorphous semiconductor film, thereby forming a crystallized semiconductor film. In this case, a light intensity distribution to be formed can be analytically controlled in accordance with a simple calculation like the case of the crystallization apparatus. As a result, a crystallized semiconductor film with a large particle size can be generated by causing a lateral growth of a crystal from a crystal nucleus based on a light intensity distribution with, e.g., a desired concave pattern suitable for crystallization.

Moreover, according to the present invention, there is provided a method comprising: illuminating a phase modulation element having a phase distribution based on a phase modulation unit optically smaller than a radius of a point spread distribution range of an image formation optical system; and forming a predetermined light intensity distribution on a predetermined surface through the image formation optical system arranged in a light path between the phase modulation element and the predetermined surface. In this case, the light intensity distribution formed on the predetermined surface can be also analytically controlled in accordance with a simple calculation in any appropriate method other than the crystallization method.

Additionally, according to the present invention, there is provided a phase modulation element having a phase distribution based on a phase modulation unit with a predetermined size, the phase modulation element having a phase distribution that area shares of a first area having a first phase value and a second area having a second phase value vary in accordance with each position. A light intensity distribution with a desired concave pattern suitable for crystallization can be formed by applying this phase modulation element to, e.g., a crystallization apparatus. As a result, a crystallized semiconductor film with a large particle size can be generated by causing a lateral growth of a crystal from a crystal nucleus based on the light intensity distribution with the desired concave pattern.

Further, it is preferable that the present invention has a plurality of cells and area shares of the first area and the second area in each cell vary in accordance with each cell. Alternatively, it is preferable that the present invention has a plurality of pixels, each pixel has a fixed phase value, and the number of pixels having the same phase value per unit range optically corresponding to the point spread distribution range varies in accordance with each unit range. Alternatively, it is preferable that the present invention has a plurality of stripe-like areas, each stripe-like area has a fixed phase value, and a width of each stripe-like area varies along a longitudinal direction. Alternatively, it is preferable that the present invention has a line-and-space pattern, each line portion has the first phase value, each space portion has the second phase value and a ratio in width of the line portion and the space portion which are adjacent to each other varies along a widthwise direction.

Furthermore, according to the present invention, there is provided a phase modulation element having a phase distribution based on a phase modulation unit with a predetermined size, wherein the phase modulation element has a cyclic divided area structure, each divided area has a fixed phase value, and the phase modulation element has a phase distribution that the phase value varies in accordance with each divided area. In this case, a light intensity distribution with a desired concave pattern suitable for crystallization can be formed by applying the phase modulation element to, e.g., a crystallization apparatus, and a crystallized semiconductor film with a large particle size can be generated by causing a lateral growth of a crystal from a crystal nucleus.

Moreover, it is preferable that the present invention has a plurality of pixels, each pixel has a fixed phase value and the phase value varies in accordance with each pixel. Alternatively, it is preferable that the present invention has a line-and-space pattern and a phase value varies in accordance with each line portion.

Additionally, according to the present invention, there is provided a phase modulation element having a phase distribution based on a phase modulation unit with a predetermined size, wherein the phase modulation element has a first stripe-like area which has a first phase distribution and extends in a direction along which a phase varies and a second stripe-like area which has a second phase distribution and extends in a direction along which a phase varies, the first stripe-like area and the second stripe-like area are adjacent to each other with a border line parallel with the direction along which the phase varies therebetween, and an average phase value on the first stripe-like area side is substantially different from an average phase value on the second stripe-like area side in a local area on the border line. In this case, a light intensity distribution with both a desired concave pattern suitable for crystallization and an inverse peak pattern can be formed by applying the phase modulation element to, e.g., a crystallization apparatus, and a crystallized semiconductor film having a large particle size can be generated by causing a lateral growth of a crystal from a crystal nucleus.

Further, the first stripe-like area and the second stripe-like area are configured to have substantially the same light intensity distributions which are formed in accordance therewith, an average phase value on the first stripe-like area side is substantially different from an average phase value on the second stripe-like area side in a first local area on the border line corresponding to a part where a light intensity in the light intensity distribution is small, and the average phase value on the first stripe-like area side is substantially equal to the average phase value on the second stripe-like area side in a second local area on the border line corresponding to a part where a light intensity in the light intensity distribution is large. Furthermore, it is preferable that the first stripe-like area and the second stripe-like area have a line-and-space pattern, each line portion has a first phase value, each space portion has a second phase value, and a ratio in width of the line portion and the space portion which are adjacent to each other varies in a widthwise direction. Alternatively, it is preferable that the first stripe-like area and the second stripe-like area have a line-and-space pattern and a phase value varies in accordance with each line portion.

It is to be noted that a processed film, i.e., a base substance manufactured by using the phase modulation element according to any of the embodiments of the present invention has a crystal caused to grow to a predetermined size in the lateral direction from a crystal nucleus, and hence an electronic device configured by using that base substance demonstrates excellent semiconductor characteristics. Moreover, a display apparatus which stably operates can be obtained by using the same base substance in, e.g., a liquid crystal display panel.

What is claimed is:

1. A crystallization method comprising:
an illuminating step for illuminating a phase modulation element which controls light intensity of incident light;
a step for forming on an amorphous semiconductor film an image of light having a concave pattern that a light intensity distribution of a pattern in which the light intensity is minimum at a center and linearly increases toward a periphery by an image formation optical system provided at an output side of the phase modulation element is repeated at a certain amplitude; and
a step for growing crystal from a crystal nucleus which is generated at a part irradiated with light having a smallest intensity of the light intensity distribution of the concave pattern, in accordance with the increase in the light intensity,
the phase modulation element forming the light intensity distribution by a phase modulation unit string in which a plurality of phase modulation units each being optically smaller than a radius of a point spread distribution range of the image formation optical system are arranged, to form exit light having the light intensity distribution of the concave pattern.

2. A crystallization method comprising:
an illuminating step for illuminating a phase modulation element which controls light intensity of incident light;
a step for forming on an amorphous semiconductor film an image of light having a concave pattern that a light intensity distribution of a pattern in which the light intensity is minimum at a center and linearly increases toward a periphery by an image formation optical system provided at an output side of the phase modulation element is repeated at a certain amplitude; and
a step for growing crystal from a crystal nucleus which is generated at a part irradiated with light having a smallest intensity of the light intensity distribution of the concave pattern, in accordance with the increase in the light intensity, and forming a predetermined light intensity distribution on a predetermined surface through the image formation optical system arranged in a light path between the phase modulation element and the predetermined surface, the phase modulation element forming the light intensity distribution by a phase modulation unit string in which a plurality of phase modulation units each being optically smaller than a radius of a point spread distribution range of the image formation optical system are arranged, to form exit light haying the light intensity distribution of the concave pattern, in the phase distribution of the phase modulation element, an occupied area ratio between a first region having a first phase value and a second region having a second phase value varying depending on a position.

* * * * *